(12) United States Patent
Berry, III et al.

(10) Patent No.: US 9,406,535 B2
(45) Date of Patent: Aug. 2, 2016

(54) ION INJECTOR AND LENS SYSTEM FOR ION BEAM MILLING

(71) Applicant: Lam Research Corporation, Fremont, CA (US)

(72) Inventors: Ivan L. Berry, III, San Jose, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 186 days.

(21) Appl. No.: 14/473,863

(22) Filed: Aug. 29, 2014

(65) Prior Publication Data
US 2016/0064260 A1    Mar. 3, 2016

(51) Int. Cl.
*B44C 1/22* (2006.01)
*H01L 21/67* (2006.01)
(Continued)

(52) U.S. Cl.
CPC ..... *H01L 21/67069* (2013.01); *H01J 37/32082* (2013.01); *H01J 37/32357* (2013.01); *H01J 37/32422* (2013.01); *H01J 37/32541* (2013.01); *H01J 37/32568* (2013.01); *H01J 37/32596* (2013.01); *H01J 37/32623* (2013.01); *H01J 37/32715* (2013.01); *H01L 21/3065* (2013.01)

(58) Field of Classification Search
CPC .............. H01J 37/32532; H01J 37/32082; H01J 37/32422; H01J 37/32623; H01L 21/67069; H01L 21/428; H01L 21/268
USPC .......................... 216/17, 65, 69, 71
See application file for complete search history.

(56) References Cited

U.S. PATENT DOCUMENTS

| 3,704,511 A | 12/1972 | Hooker |
| 3,899,711 A | 8/1975 | Lemmond |
| 4,200,794 A | 4/1980 | Newberry et al. |

(Continued)

FOREIGN PATENT DOCUMENTS

| CA | 1157511 | 11/1983 |
| CA | 1184239 | 3/1985 |
| WO | WO 2013/012620 | 1/2013 |

OTHER PUBLICATIONS

U.S. Appl. No. 14/458,161, filed Aug. 12, 2014, entitled "Differentially Pumped Reactive Gas Injector."

(Continued)

*Primary Examiner* — Binh X Tran
(74) *Attorney, Agent, or Firm* — Weaver Austin Villeneuve & Sampson LLP

(57) ABSTRACT

The embodiments herein relate to methods and apparatus for performing ion etching on a semiconductor substrate, as well as methods for forming such apparatus. In some embodiments, an electrode assembly may be fabricated, the electrode assembly including a plurality of electrodes having different purposes, with each electrode secured to the next in a mechanically stable manner. Apertures may be formed in each electrode after the electrodes are secured together, thereby ensuring that the apertures are well-aligned between neighboring electrodes. In some cases, the electrodes are made from degeneratively doped silicon, and the electrode assembly is secured together through electrostatic bonding. Other electrode materials and methods of securing may also be used. The electrode assembly may include a hollow cathode emitter electrode in some cases, which may have a frustoconical or other non-cylindrical aperture shape. A chamber liner and/or reflector may also be present in some cases.

17 Claims, 9 Drawing Sheets

(51) Int. Cl.
*H01L 21/3065* (2006.01)
*H01J 37/32* (2006.01)

(56) References Cited

U.S. PATENT DOCUMENTS

| | | | |
|---|---|---|---|
| 4,419,580 | A | 12/1983 | Walker et al. |
| 6,617,595 | B1 | 9/2003 | Okunuki |
| 7,037,846 | B2 | 5/2006 | Srivastava et al. |
| 7,416,989 | B1 | 8/2008 | Liu et al. |
| 7,977,249 | B1 | 7/2011 | Liu et al. |
| 7,981,763 | B1 | 7/2011 | van Schravendijk et al. |
| 8,058,179 | B1 | 11/2011 | Draeger et al. |
| 8,187,486 | B1 | 5/2012 | Liu et al. |
| 8,608,973 | B1 | 12/2013 | Guha |
| 8,617,411 | B2 | 12/2013 | Singh |
| 2005/0199822 | A1* | 9/2005 | Saini ................ B82Y 10/00 250/398 |
| 2006/0192104 | A1* | 8/2006 | Schultz ............. G01N 27/622 250/287 |
| 2007/0063337 | A1 | 3/2007 | Schubert et al. |
| 2012/0288799 | A1* | 11/2012 | Takase .............. B82Y 40/00 430/296 |
| 2013/0216959 | A1* | 8/2013 | Tanaka ............. H01J 37/026 430/325 |
| 2014/0021343 | A1* | 1/2014 | Kirkpatrick ........ H01J 37/05 250/251 |
| 2014/0076716 | A1* | 3/2014 | Gorokhovsky ... H01J 37/32357 204/192.12 |
| 2015/0311292 | A1 | 10/2015 | Srinivasan et al. |
| 2016/0049281 | A1 | 2/2016 | Berry, III et al. |
| 2016/0064232 | A1 | 3/2016 | Berry, III et al. |
| 2016/0111294 | A1 | 4/2016 | Berry, III et al. |

OTHER PUBLICATIONS

U.S. Appl. No. 15/054,023, filed Feb. 25, 2016, entitled "Ion Beam Etching Utilizing Cryogenic Wafer Temperatures".
U.S. Appl. No. 13/908,676, filed Jun. 3, 2013, entitled "Temperature Controlled Substrate Support Assembly".
US Office Action, dated Feb. 17, 2016, issued in U.S. Appl. No. 14/520,070.
U.S. Appl. No. 14/520,070, filed Oct. 21, 2014, entitled "Use of Ion Beam Etching to Generate Gate-All-Around Structure."
U.S. Appl. No. 14/592,820, filed Jan. 8, 2015, entitled "Ion Beam Etch Without Need for Wafer Tilt or Rotation."

* cited by examiner

ION INJECTOR AND LENS SYSTEM FOR ION BEAM MILLING

BACKGROUND

Fabrication of semiconductor devices typically involves a series of operations in which various materials are deposited onto and removed from a semiconductor substrate. One technique for material removal is ion beam etching, which involves delivering ions to the surface of a substrate to physically and/or chemically remove atoms and compounds from the surface in an anisotropic manner. The impinging ions strike the substrate surface and remove material through momentum transfer (and through reaction in the case of reactive ion etching).

SUMMARY

Various embodiments herein relate to methods and apparatus for performing ion beam etching to remove material from a substrate. Certain embodiments relate to methods for forming an electrode assembly used in an ion beam etching application. Other embodiments relate to the electrode assemblies formed by such methods. Many different embodiments are presented herein. The various features of the different embodiments may be combined as desired for a particular application.

In one aspect of the disclosed embodiments, a method of making an electrode assembly for use in an ion beam etching reactor is provided, the method including: providing a first electrode, a second electrode and a third electrode; providing and securing a first inter-electrode structure such that it is immobilized between the first electrode and the second electrode, and providing and securing a second inter-electrode structure such that it is immobilized between the second electrode and the third electrode, where the first electrode, second electrode, third electrode, first inter-electrode structure, and second inter-electrode structure are substantially vertically aligned with one another to form the electrode assembly; and forming a plurality of apertures in the first electrode, second electrode and third electrode while the first inter-electrode structure and the second inter-electrode structure are immobilized in the electrode assembly.

In some embodiments, the first electrode, second electrode, and third electrode include degeneratively doped silicon, where securing the first inter-electrode structure includes attaching the first inter-electrode structure to the first electrode and/or to the second electrode, and where securing the second inter-electrode structure includes attaching the second inter-electrode structure to the second electrode and/or to the third electrode. Electrostatic bonding may be used to create very good connections between the relevant pieces in some cases. In other embodiments, securing the first inter-electrode structure includes depositing the first inter-electrode structure directly on the first electrode or the second electrode, and/or securing the second inter-electrode structure includes depositing the second inter-electrode structure directly on the second electrode or the third electrode. In certain cases, securing the first inter-electrode structure includes providing adhesive or a glass frit to secure the first inter-electrode structure between the first electrode and the second electrode, and/or securing the second inter-electrode structure includes providing adhesive or a glass frit to secure the second inter-electrode structure between the second electrode and the third electrode. In some implementations, securing the first inter-electrode structure and securing the second inter-electrode structure includes forming two or more guide holes in each of the first electrode, second electrode, and third electrode, and inserting pins through the guide holes. In these or other cases, securing the first inter-electrode structure and securing the second inter-electrode structure includes providing brackets or clamps that directly or indirectly secure the first inter-electrode structure and the second inter-electrode structure and that directly secure at least the first electrode and the third electrode. The first inter-electrode structure and/or the second inter-electrode structure may be a continuous layer of material before forming the apertures in some cases.

In some embodiments, forming apertures in first electrode, second electrode and third electrode further includes forming apertures in the first inter-electrode material and in the second inter-electrode material. The method may further include after forming the apertures, immersing the electrode assembly in etching solution to thereby etch and remove at least a portion of the first inter-electrode material and a portion of the second inter-electrode material. Immersing the electrode assembly in etching solution may result in the formation of support structures in contact with either the first electrode and the second electrode, or in contact with the second electrode and the third electrode, the support structures being formed from the first inter-electrode structure and the second inter-electrode structure. The first, second, and third electrodes may be shaped, before and/or after forming the apertures, to prevent the electrodes from bowing.

Further, the first, second, and third electrodes and the first and second inter-electrode structures may have coefficients of thermal expansion (CTE) that differ from one another by about 50% or less. In other cases the CTEs match even more closely. In some cases, dust is removed from between the first and second electrode and/or from between the second and third electrodes, after forming the apertures. The apertures may be drilled with a laser in certain cases, for example a Q-switched $CO_2$ laser, a pulsed UV laser, or a diode pumped solid-state laser (DPSS). Another process for forming the apertures includes positioning one or more metal structures on the first electrode; placing the electrode assembly in an electrolytic bath; and applying an electric field to thereby cause the metal structure(s) to form one or more apertures in the first electrode, the first inter-electrode material, the second electrode, the second inter-electrode material, and the third electrode. The method may further include before placing the electrode assembly in the electrolytic bath, securing a reflector precursor layer to the third electrode, opposite the second inter-electrode structure; and after the one or more metal structures form the one or more apertures in the third electrode, tilting the electrode assembly in the electrolytic bath and continuing to apply the electric field to thereby form one or more apertures in the reflector precursor layer to form a reflector, where the apertures in the third electrode are aligned with the apertures in the reflector at an interface between the third electrode and the reflector, and where the apertures do not provide a direct line of sight through the electrode assembly and reflector. More generally speaking, in some cases, the method includes attaching a reflector to the third electrode, where the reflector blocks a direct line-of-sight through the electrode assembly.

In certain cases, the electrodes are fabricated to include apertures having different diameters for the different electrodes. For instance, the third electrode may have an aperture diameter that is larger than the aperture diameter of the second electrode (e.g., up to about 30% larger). Similarly, the second electrode may have an aperture diameter that is larger than the aperture diameter of the first electrode (e.g., up to about 30% larger). In certain embodiments, the apertures in one or more of the electrodes have a taper of about 10° or less.

Gas pathways may be formed in the first inter-electrode structure and/or in the second inter-electrode structure. The gas pathways may allow gas to escape outwards from an interior region of the electrode assembly during etching.

In certain embodiments, before or after forming the apertures, a fourth electrode may be provided to the electrode assembly, the fourth electrode being provided above the first electrode, where the fourth electrode forms a hollow cathode emitter electrode having a plurality of hollow cathode emitters. The hollow cathode emitter electrode may have an upper surface and a lower surface, the lower surface facing the first electrode. In various cases, before, during, or after forming the apertures in the first, second, and third electrodes, a plurality of holes may be formed in the hollow cathode emitter electrode, each hole having a diameter that is larger at the upper surface and smaller toward the lower surface, where the holes are aligned with a position of the apertures after the apertures are formed in the first, second, and third electrodes. The hollow cathode emitters of the hollow cathode emitter electrode may have various shapes. In certain cases, the holes in the hollow cathode emitter electrode include a lower cylindrical portion and an upper variable diameter portion. The upper variable diameter portion may have a funnel shape. In certain similar embodiments, the first electrode may be fabricated as a hollow cathode emitter electrode having any of the properties described with respect to the hollow cathode emitter electrode.

Various embodiments herein relate to methods and apparatus for performing ion beam etching. These embodiments may utilize an electrode assembly fabricated according to the disclosed techniques. However, such electrode assemblies are not necessarily present in all embodiments.

For instance, in another aspect of the disclosed embodiments, a method of etching a semiconductor substrate is provided, the method including: positioning a substrate on a substrate support, wherein a rotation mechanism coupled to the substrate support is configured to rotate the substrate at an accuracy of about 2° or better; applying a first bias to a first electrode and a second bias to a second electrode, where the first and second electrodes include apertures therein, and supplying plasma above the first and second electrodes, where ions pass through the apertures in the first and second electrodes toward a surface of the substrate; while supplying the plasma, cyclically rotating the substrate and substrate support in a first direction and in a second direction that is opposite the first direction; and etching the substrate as a result of ions or particles impacting the surface of the substrate while the substrate is rotated.

The rotations are limited by the configuration of the substrate support. In other words, the substrate may rotate about 215° or less from a central starting position in the first direction, and rotate about 215° or less from the central starting position in the second direction. Because the substrate begins the rotation in the second direction from an end point of the rotation in the first direction, the rotation in the second direction may be about 430° or less overall. Likewise, once the substrate rotates in the first direction again, the rotation starts from an end point of the rotation in the second direction, and thus, the second (or nth) rotation in the first direction may be about 430° or less. In some cases, the substrate support is configured to rotate about ±180° or less. Such a configuration may permit substrate rotations of about 360° in either direction as measured from the central measuring point.

Different rates of rotation may be used during different portions of the rotations. For instance, the substrate may rotate at a first average rotation rate when rotating in the first direction, and at a second average rotation rate when rotating in the second direction, the first and second average rotation rates being different. In another example, the substrate rotations in each direction may include a slower portion and a faster portion. The ions or particles may impact the surface of the substrate during only a portion of the rotations. For instance, the ions or particles may impact the surface of the substrate when the substrate rotates in the first direction but not when the substrate rotates in the second direction. Similarly, the ions or particles may impact the surface of the substrate during the slower portion of a rotation but not during the faster portion of a rotation.

In various embodiments, the substrate support is configured to rotate and/or tilt the substrate at an accuracy of about 2° or better. Such accuracy is particularly beneficial where the substrate rotates in two different directions. The method may include impacting the ions on a reflector positioned below the second electrode, thereby neutralizing the ions to form the particles. The method may also include passing ions through apertures in a third electrode positioned below the second electrode. The third electrode may be grounded. The third electrode may be positioned above the reflector in cases where both elements are present. In some embodiments, the method further includes generating a plurality of micro-jet plasma discharges in a plurality of hollow cathode emitters in a hollow cathode emitter electrode positioned above the first and second electrodes, where the micro-jet plasma discharges are aligned with the apertures in the first and second electrodes.

The rotation patterns described with regard to the previous embodiments may be utilized in any of the etching and etching apparatus embodiments disclosed herein. However, such rotation patterns (i.e., cyclic bi-directional rotation) are not needed in every embodiment. Other embodiments may be configured to utilize continuous rotation in a single direction, for example.

In another aspect of the disclosed embodiments, a method of etching a semiconductor substrate is provided, the method including: providing a substrate to a reaction chamber including: a first electrode, a second electrode, and a third electrode, each electrode having a plurality of apertures formed therein, where the apertures are formed after the first electrode, second electrode, and third electrode are immobilized with respect to one another in an electrode assembly, and where the apertures are formed in the first electrode, the second electrode, and the third electrode in a single operation, a substrate support, and one or more gas inlets; generating or supplying plasma above the first electrode; applying a first bias to the first electrode and applying a second bias to the second electrode to thereby direct ions toward the substrate in collimated ion beams; and etching the substrate as a result of the ions being directed toward the substrate.

As noted above, the electrode assembly may be formed through any of the assembly formation methods discussed herein.

The method may further include impacting the ions on a reflector positioned below the third electrode to thereby neutralize the ions and provide a neutral beam. In certain implementations, the method includes cyclically rotating the substrate in a first direction and in a second direction opposite the first direction. The substrate support may be configured to move about ±215° or less, for example about ±180°, or between about ±180° and ±215°. The reaction chamber may further include a shutter that is configured to prevent the ions from impinging upon the substrate when the shutter is closed. The shutter may prevent ions from impinging upon the substrate while the substrate is rotated in a particular direction. In these or other cases, the shutter may prevent ions from impinging upon the substrate during a particular portion of each rotation (e.g., blocking ions when the substrate rotates during a faster portion and not blocking the ions when the substrate rotates during a slower portion of the rotation). In some cases, rotating the substrate includes rotating the substrate at a first average speed in the first direction and at a second average speed in the second direction, the first average speed being different from the second average speed.

The method may further include tilting the substrate during etching. Such tilting may result in collimated ion beams or particle beams impacting the substrate at a non-normal angle. As noted with respect to certain other aspects of the disclosed embodiments, the reaction chamber may further include a fourth electrode above the first electrode, where the fourth electrode is a hollow cathode emitter electrode having a plurality of hollow cathode emitters. In such cases, generating plasma above the first electrode may include generating plasma in the hollow cathode emitters. Such plasma generation may be in addition to plasma generation that occurs above the hollow cathode emitter electrode. Generating plasma in the hollow cathode emitters may include applying an RF bias to the hollow cathode emitter electrode. In certain cases, the method further includes generating a pressure differential of about 1 Torr or greater above vs. below the hollow cathode emitter electrode. In some embodiments, a gas conductance through the hollow cathode emitter electrode is about 800 L/min or less.

In another aspect of the disclosed embodiments, an apparatus for etching a semiconductor substrate is provided, the apparatus including a reaction chamber including: an ion source configured to expose the substrate with a flux of ions or neutral particles generated from the ions; a substrate support configured to support the substrate during etching; a rotation mechanism for tilting and rotating the substrate and substrate support, the rotation mechanism configured to rotate and tilt the substrate each at an accuracy of about 2° or better; and a controller having instructions to set a substrate tilt angle, rotation angle, and ion energy during etching. The substrate support may be configured to rotate about ±215° or less, for example ±180°, with respect to a central starting position at 0°. In some embodiments, the rotation mechanism includes a sensor, stepper, or other mechanism that can detect a rotational position of the substrate at an accuracy of about 2° or better. In certain cases the ion source includes a plurality of electrodes secured together into an electrode assembly as described herein. Further, the apparatus may include a hollow cathode emitter electrode having a plurality of hollow cathode emitters therein.

In yet another aspect of the disclosed embodiments, an apparatus for etching a semiconductor substrate is provided, the apparatus including: a reaction chamber; a substrate support; an inlet for supplying one or more gases or plasma to the reaction chamber; a first electrode, a second electrode, and a third electrode, each having a plurality of apertures therein, where the second electrode is positioned below the first electrode and the third electrode is positioned below the second electrode; a hollow cathode emitter electrode having a plurality of hollow cathode emitters, where the hollow cathode emitters are aligned with the apertures in the first, second, and third electrodes, and where the hollow cathode emitter electrode is positioned above the first electrode; and one or more RF sources configured to do one or more of (i) generate a plasma above the hollow cathode emitter electrode, (ii) apply a bias to the hollow cathode emitter electrode, (iii) apply a bias to the first electrode, and/or (iv) apply a bias to the second electrode.

In some embodiments, the one or more RF sources are configured to do three or more of (i)-(iv), for example all of (i)-(iv). The apparatus may further include a rotation mechanism configured to rotate the substrate and substrate support with an accuracy of about 2° or better. The apparatus may further include a controller having instructions to control a tilt angle, rotation angle, and ion energy during etching. Further, the apparatus may include a reflector positioned below the third electrode, where the reflector is operable to neutralize ions passing through the apertures in the first, second, and third electrodes during etching.

In certain cases, the electrodes include apertures having different diameters for the different electrodes. For instance, the third electrode may have an aperture diameter that is larger than the aperture diameter of the second electrode (e.g., up to about 30% larger). Similarly, the second electrode may have an aperture diameter that is larger than the aperture diameter of the first electrode (e.g., up to about 30% larger). In certain embodiments, the apertures in one or more of the electrodes have a taper of about 10° or less. The gas conductance through the hollow cathode emitters may be fairly low, for example about 800 L/min or less when a gas flow rate of about 1 SLM is provided above the hollow cathode emitter electrode.

In another aspect of the disclosed embodiments, an apparatus for etching a substrate is provided, the apparatus including: a reaction chamber including: a substrate support configured to support a substrate during etching, one or more inlets for providing gas phase reactants and/or plasma to the reaction chamber, an electrode assembly comprising a first electrode, a second electrode, and a third electrode, each electrode comprising a plurality of apertures, where the apertures of each electrode are formed in a single process including: securing the first electrode, second electrode and third electrode together such that they are vertically stacked and immobilized with respect to one another, and after securing the first electrode, second electrode and third electrode together, forming the apertures in the first electrode, second electrode, and third electrode such that the apertures in each electrode are aligned.

The first, second, and third electrode may be secured to one another in an electrode assembly. The electrode assembly may be formed through any of the disclosed methods. In some cases, at least one of the first electrode, second electrode, and third electrode has a thickness between about 0.5 mm-10 cm, or between about 1 mm-3 cm, for example about 5 mm. The apertures may have a diameter between about 0.5-1 cm. Other aspects of aperture dimensions are described herein.

In some cases, the electrodes are made from degeneratively doped silicon. In such cases, the first electrode may be secured to the second electrode via a first inter-electrode structure that is electrostatically bonded to at least one of the first electrode and the second electrode, and the second electrode may be secured to the third electrode via a second inter-electrode structure that is electrostatically bonded to at least one of the second electrode and the third electrode. In certain embodiments, at least one of the first and second inter-electrode structures include silicon oxide. At least one of the first and second inter-electrode structures may support the first, second, and/or third electrodes at or near their peripheries. In some cases, at least one of the first and second inter-electrode structures includes a ring and/or ribs. In certain implementations, the first, second, and third electrodes include a refractory metal.

The substrate support may be configured to rotate ±215° or less during etching, for example about ±180°. A controller may have instructions to rotate the substrate and substrate support cyclically in a first direction and a second direction opposite the first direction. Variable rotation speeds may be used during the rotations. A shutter may be used to prevent ions and/or particles from impacting the substrate during certain portions of the rotations. In certain embodiments, a chamber liner may be used to cover interior surfaces of the reaction chamber during etching, where the chamber liner includes a sputter-resistant material.

These and other features will be described below with reference to the associated drawings.

DETAILED DESCRIPTION

Figure 1:
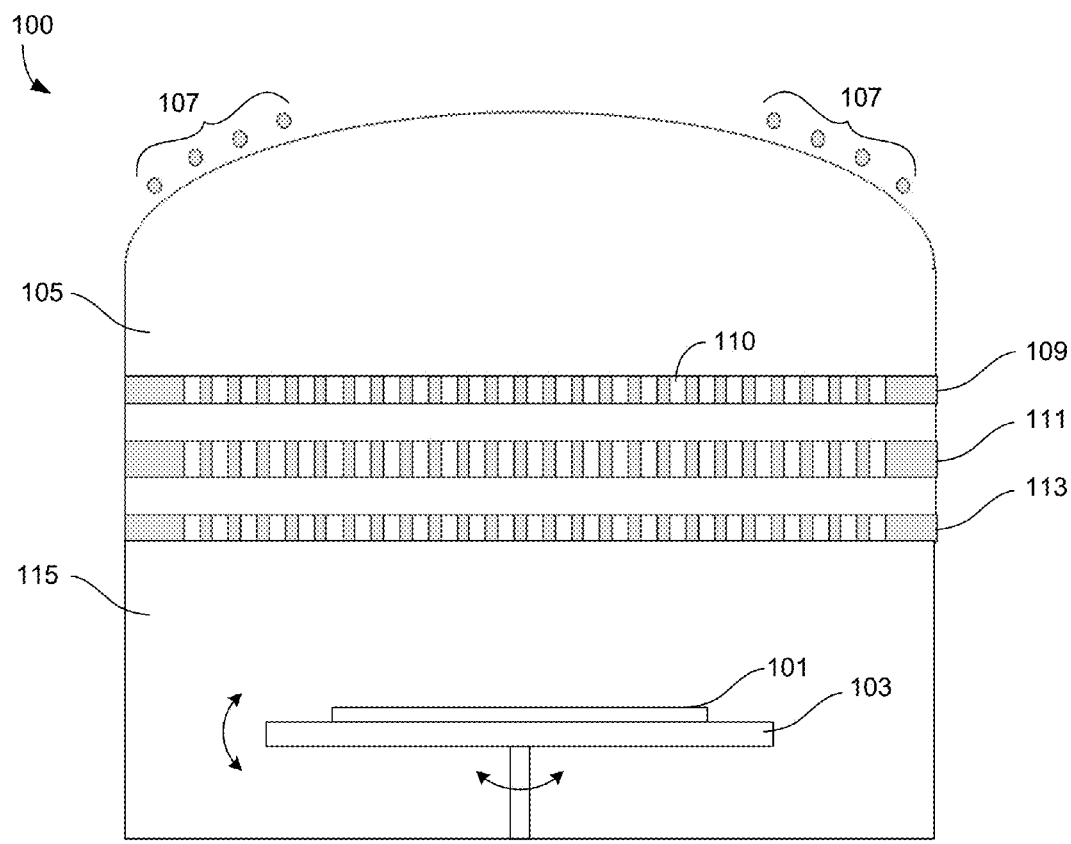
FIG. 1 depicts a simplified view of a reaction chamber used for etching semiconductor substrates.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, electro-optical devices, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Ion beam etching is commonly used in fabrication of semiconductor devices. As mentioned above, ion beam etching involves removing material from the surface of a substrate by delivering energetic ions to the substrate surface. Ion beam etching may be broadly categorized into processes that solely involve inert ions (e.g., argon ions), and processes that involve reactive ions or chemical reactions initiated by ions (e.g., oxygen ions, certain ionized compounds such as fluorine-containing ionized compounds, reactive or inert ions initiating a chemical reaction with a reactant chemisorbed or physisorbed on the surface on the substrate, etc.). In these of processes, ions impinge on the substrate surface and remove material through either direct physical momentum transfer (sputtering) or a chemical reaction initiated by the energy transfer from the ions (reactive ion beam etching or chemically assisted ion beam etching). Reactive ion beam etching (RIBE) typically involves utilization of an ion that can chemically react with the substrate (such as oxygen, fluorine and the like). In chemically assisted ion beam etching (CAIBE), an inert ion either initiates a chemical reaction between the substrate and a reactant (such as an applied gas that is adsorbed on the surface), or generates a reactive site on the surface of the substrate that reacts with an applied reactant coincident with or subsequent to the generation of the reactant site, or any combination thereof.

Certain applications for ion beam etching processes relate to etching of non-volatile materials. In some cases, the material etched is a conductive material. In certain embodiments, the material is etched in the context of forming a magnetoresistive random-access memory (MRAM) device, a spin-torque-transfer memory device (STT-RAM), a phase-change memory device (PSM), a non-volatile conductor (copper, platinum, gold, and the like). In other applications, the ability to control the ion incident angle to the substrate can be useful in generating 3D devices such as vertically stacked memory.

When performing ion beam etching processes, it is desirable to promote a highly uniform ion flux over the substrate surface. A high degree of uniformity is beneficial in creating reliable devices across the entire surface of the substrate. Further, it may be desirable in certain cases to promote a high ion flux and/or a high flux of a gas phase reactant. High flux can help maximize throughput. Another factor that affects the quality of the etching results is the ability to control the energy and angle at which the ions impact the surface. These factors are important in forming features having desired dimensions and profiles.

FIG. 1 presents a simplified cross-sectional view of an apparatus 100 for performing ion beam etching according to certain methods. In this example, substrate 101 rests on substrate support 103, which may be equipped with hardware (not shown) to provide electrical and fluidic connections. The electrical connections may be used to supply electricity to the substrate support 103 or to an electrostatic chuck located on or within the substrate support 103 (not shown) in some cases, while the fluidic connections may be used to provide fluids used to control the temperature of the substrate 101 and substrate support 103. The substrate support 103 may be heated by a heater (not shown) or cooled by a cooling mechanism (not shown). The cooling mechanism may involve flowing cooling fluids through piping in or adjacent the substrate support 103. The substrate support 103 may be capable of rotating and tilting at variable speeds and angles, as indicated by the double headed arrows in FIG. 1.

A plasma generation gas is delivered to a primary plasma generation region 105. The plasma generation gas is energized by a plasma source 107. In the context of FIG. 1, the plasma source 107 is a coil that acts as an inductively coupled plasma source. Other sources such as capacitively coupled sources, microwave sources or discharge sources may be employed in appropriately designed reactors. Plasma forms in the primary plasma generation region 105. An extraction electrode 109 includes a series of apertures 110 through which ions are extracted.

The apertures 110 may have a diameter between about 0.5-1 cm, and a height that is defined by the thickness of the electrode. The apertures 110 may have a height to width aspect ratio (AR) between about 0.01-100.0. In some cases the apertures 110 are arranged in a hexagonal, square grid, or spiral pattern, though other patterns may be used as well. A center-to-center distance between neighboring apertures may be between about 1 mm-10 cm. The apertures may be configured to achieve an overall open area (i.e., sum of the area of each aperture) that is between about 0.1%-95% of the surface area of the electrode when considering only a single (top or bottom) face of the electrode. For example, an electrode having a diameter of 40 cm and 500 holes each having a diameter of 1 cm will have an open area of about 31% (393 cm$^2$ open area divided by 1257 cm$^2$ total area). The apertures 110 may have different diameters in different electrodes. In some cases, the aperture diameter is smaller in upper electrodes and larger in lower electrodes. In one embodiment, the apertures in a lower electrode 113 are larger than the apertures in a focus electrode 111 (e.g., between about 0-30% larger). In these or other cases, the apertures in the focus electrode 111 are larger than the apertures in the extraction electrode 109 (e.g., between about 0-30% larger).

The bias $V_1$ applied to the extraction electrode 109 with respect to the substrate 101 acts to provide kinetic energy to the ion with respect to the substrate. This bias is generally positive and can range between about 20-10,000 volts or more. In certain cases the bias on the extraction electrode is between about 20-2,000 volts. Positive ions in the plasma above extraction electrode 109 are attracted to the lower electrode 113 by the potential difference between electrodes 109 and 113. Focus electrode 111 is added to focus the ions, and if needed, repel electrons. A bias $V_2$ on this electrode can be either positive or negative with respect to the extraction electrode 109, but is generally biased negatively. The bias potential of focus electrode 111 is determined by the lensing characteristics of the focusing electrode 111. Bias voltages on the focus electrode include positive voltages between about 1.1× to 20× the potential $V_1$ on the extraction electrode, and negative voltages having a magnitude between about 0.001× to 0.95× the potential of $V_1$. Due to the different potentials applied to the different electrodes, a potential gradient exists. The potential gradient may be on the order of about 1000 V/cm. Example separation distances between neighboring electrodes fall between about 0.1-10 cm, or for example about 1 cm.

After the ions leave the bottom of the grounded lower electrode 113, they travel in a collimated and focused beam if the focus electrode 111 voltage is set to produce a collimated beam. Alternatively the beam can be made divergent if the focus electrode voltage is adjusted to either under- or over-focus the ion beam. The lower electrode 113 is grounded in many (but not all) cases. The use of a grounded lower electrode 113 in combination with a grounded substrate 101 results in a substrate processing region 115 that is substantially field free. Having the substrate located in a field-free region prevents electrons or secondary ions generated by collisions between the ion beam with residual gases or with surfaces in the reaction chamber from being accelerated towards the substrate, thereby minimizing the risk of causing unwanted damage or secondary reactions.

Additionally, it is important to prevent the substrate 101 from charging from the ion beam itself, or from ejected secondary electrons generated during the ion beam collision with the substrate. Neutralization is typically accomplished by adding a low energy electron source (not shown) in the vicinity of the substrate 101. Since the positive charge on the ion and the ejected secondary electrons both charge the substrate positively, low energy electrons in the vicinity of the substrate can be attracted to the positively charged surface and can neutralize this charge. Performing this neutralization is much easier in a field free region.

In some applications it may be desirable to have a potential difference between the lower electrode 113 and substrate 101. For example, if very low energy ions are required, it is difficult to maintain a well-collimated beam at low energy over long distances due to mutual repulsion of the positively charged ions (space-charge effects). One solution to this is to place a negative bias on the lower electrode 113 with respect to substrate 101 (or conversely biasing substrate 101 positively with respect to the lower electrode 113). This allows extracting the ions at higher energy, then slowing them down as they approach the substrate.

In certain ion beam etching operations, one of the three electrodes may be omitted. Where this is the case, there is less flexibility regarding the energy at which ions are directed to the surface of the substrate. This limitation arises because in order for the ions to be focused and directed as desired, a particular ratio of bias potentials should be applied to the two electrodes. The ratio of bias potentials is controlled by the focusing characteristics and geometries of the two electrodes. As such, where a particular geometry is used and a particular bias/electrical state is desired on the lower electrode (e.g., grounded), there is little or no flexibility in the bias applied to the upper electrode. The result is that a reaction chamber using such a setup is limited in the range of ion energy that may be imparted to ions as they travel through the various electrodes. The introduction of a third electrode allows the ions to be focused/directed as desired at many different ion energies, as described above.

Each of the electrodes 109, 111, and 113 has a thickness, which may be between about 0.5 mm-10 cm, or between about 1 mm-3 cm, for example about 5 mm. The electrodes 109, 111, and 113 may each be the same thickness, or they may have different thicknesses. Further, the separation distance between the extraction electrode 109 and the focus electrode 111 may be the same, greater, or less than the separation distance between the focus electrode 111 and the lower electrode 113. Each electrode 109, 111, and 113 also has dimensions, which may be less than, equal to or greater than the dimensions of the substrate being processed. In certain embodiments, the electrodes' dimensions are close to that of the substrate or substrate support (e.g., within about 50%).

The electrodes 109, 111, and 113, may be circular, rectangular or other polygonal shape. In certain embodiments the electrodes are long and narrow, wherein the long dimension is approximately equal to or greater than one dimension of the substrate, and the substrate is scanned in the orthogonal direction such that the ion beam strikes uniformly across the substrate surface when averaged over time.

The apertures 110 in the extraction electrode 109, focus electrode 111 and lower electrode 113 may be precisely aligned with one another. Otherwise, ions will be aimed incorrectly, and the on-wafer etching results will be poor. For instance, if a single aperture in the focus electrode 111 is misaligned, it may result in one area of the substrate 101 becoming over-etched (where too many ions are directed) and another area of the substrate 101 becoming under-etched (where no ions or too few ions are directed). As such, it is desirable for the apertures to be as aligned with one another as much as possible. In various cases the misalignment between vertically adjacent electrodes is limited to about 1% or less of the hole diameter (as measured by the distance of a linear shift in the position of the aperture as compared to the adjacent aperture).

Ion beam etching processes are typically run at low pressures. In some embodiments, the pressure may be about 100 mTorr or less, for example about 1 mTorr or less, and in many cases about 0.1 mTorr or less. The low pressure helps minimize undesirable collisions between ions and any gaseous species present in the substrate processing region. In certain cases, a relatively high pressure reactant is delivered in an otherwise low pressure ion processing environment. Apparatus for achieving such processing methods are described in U.S. patent application Ser. No. 14/458,161, filed Aug. 12, 2014, and titled "DIFFERENTIALLY PUMPED REACTIVE GAS INJECTOR," which is herein incorporated by reference in its entirety.

Ion beam etching processes may be used for atomic layer etching processes in some embodiments. Atomic layer etching methods are further discussed in the following U.S. patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

Electrode Material

Typically, the material used to construct the electrodes should be high temperature compatible in order to accommodate the substantial heating that occurs in many ion milling processes. Typically, the electrode material should also be mechanically rigid such that the electrodes do not bend or bow to a substantial degree when installed in an ion milling apparatus. Less rigid materials may be supported by additional support structures as discussed below. In many conventional cases the electrodes are constructed from a refractory metal (e.g., tungsten, tantalum, and molybdenum are typical). Unfortunately, physical sputtering of the electrodes often results in heavy metal contamination in the devices being fabricated. This contamination can deleteriously affect the performance of the devices.

In certain embodiments herein, one or more (in some cases all) of the electrodes are made from doped silicon (e.g., degenerately doped silicon). Intrinsic and lightly doped silicon may not be sufficiently conductive to serve as an electrode. The silicon may be polycrystalline or single crystalline. The dopant may be arsenic, boron, phosphorus, or a combination thereof. The dopant may be present at a concentration/composition of at least about $10^{20}$ atoms/cm$^3$, for example between about $10^{20}$-$10^{23}$ atoms/cm$^3$, or between about $10^{22}$-$10^{23}$ atoms/cm$^3$. The electrodes may have a conductivity between about 0.1-0.01 Ω-cm.

Silicon has a low thermal expansion coefficient, meaning that it does not undergo significant volume expansion as the silicon is heated. Additionally, silicon is stable at high temperatures and has a relatively low sputter yield (e.g., about 0.2 for 200 eV Argon). Further, even when material does sputter off of the silicon electrodes, most semiconductor devices are less sensitive to silicon surface contamination compared to contamination from most metals. The silicon can be of a single crystal or poly-crystalline or amorphous type or any combination of these types. Further, silicon electrodes may be fabricated together as an assembly in ways that the conventional metal electrodes cannot, as discussed further below.

In certain embodiments, one or more of the electrodes are made from a material other than silicon. In other cases, one or more electrodes may include tungsten, tantalum, molybdenum, niobium, rhenium, titanium, vanadium, chromium, zirconium, ruthenium, rhodium, hafnium, osmium, iridium, or a combination thereof. While silicon-based electrodes provide certain benefits, their use is not required in all embodiments.

Structure and Fabrication of Electrode Assembly

In conventional ion beam milling apparatus, each electrode is individually fabricated. Fabrication involves forming a plate of material and then forming apertures in the plate. The apertures in each electrode are placed such that they align with the apertures in the other electrodes. Optical alignment methods may be used to align apertures between neighboring plates. Where apertures are not perfectly aligned with one another, the ion trajectory through such apertures is skewed. Ions that travel along such a skewed trajectory will impact the substrate at an angle that is non-uniform compared to ions that pass through aligned apertures. Where the misalignment is substantial, the ions may be blocked entirely from passing through such misaligned apertures. The skewing and blocking of ion trajectories as the ions pass through the electrodes result in non-uniform ion impingement on the wafer surface (in terms of both the impact angle and the flux), which results in non-uniform ion milling results. The number of individual apertures on a single electrode may range between about 1-20,000, for example between about 10-5,000. Due to the large number of apertures and the fact that three different electrodes are separately formed and aligned, it is easy to fabricate electrodes with misaligned holes.

An example fabrication technique will now be described. In certain embodiments herein, a different order of operations is used. First, undrilled electrodes are formed into an assembly. Next, a single unified process is used to form apertures in all the electrodes in the assembly. This fabrication scheme results in electrodes that produce extremely well-aligned and uniform ion trajectories and flux. One reason this fabrication scheme has been avoided in the past is that it is very difficult to adequately secure and machine the electrodes together in a way that is mechanically stable during the aperture formation process, which may involve laser drilling (e.g., with a $CO_2$, UV or DPSS laser). Due to this mechanical instability, electrodes may fracture or become misaligned during the aperture formation process.

In some embodiments, the use of silicon-based electrodes permits an alternative method for securing the electrodes together in a mechanically stable way. In particular, a silicon electrode can be bonded to an inter-electrode material such as silicon dioxide, which can be bonded to another silicon electrode. In certain embodiments, the bonding is electrostatic bonding. Such bonding methods are sometimes referred to as anodic bonding. This method may be used to produce an electrode assembly having multiple electrodes separated from one another by inter-electrode layers or structures made of silicon dioxide or another material. Electrostatic and other bonding/joining methods are discussed further below.

Figure 2:
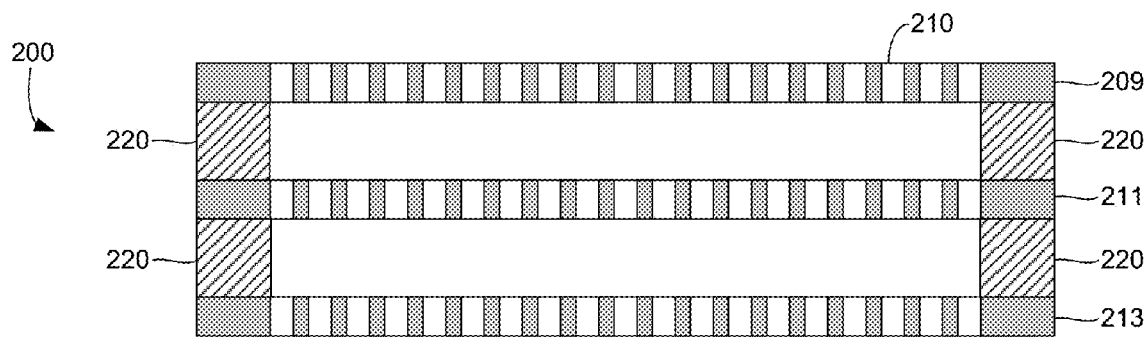
FIG. 2 illustrates a cross-sectional view of an electrode assembly according to certain embodiments.

FIG. 2 presents a cross-sectional view of an electrode assembly 200 that includes an extraction electrode 209, a focus electrode 211, and a lower electrode 213. In some embodiments the electrodes are degenerately doped silicon, as described above. In other embodiments, more conventional electrode materials are used. Adjacent electrodes are separated by inter-electrode structures 220. The inter-electrode structures may be rings, grids, webs, ribs, etc. Example inter-electrode structures are further shown and described with relation to FIG. 3. The inter-electrode structures 220 serve at least two main purposes. First, the inter-electrode structures 220 support the electrodes to maintain a distance of separation between them and provide structural rigidity to the electrode assembly 200. Next, the inter-electrode structures 220 attach/bond the electrodes together in a mechanically stable fashion such that the apertures 210 can be drilled into each electrode 209, 211, and 213 in a single unified process. This unified process ensures that the apertures 210 are perfectly aligned between adjacent plates, such that ion trajectories through the various apertures 210 are extremely uniform in terms of impact angle and flux. FIG. 2 presents the electrode assembly 200 after the apertures 210 have been drilled.

Figure 3:
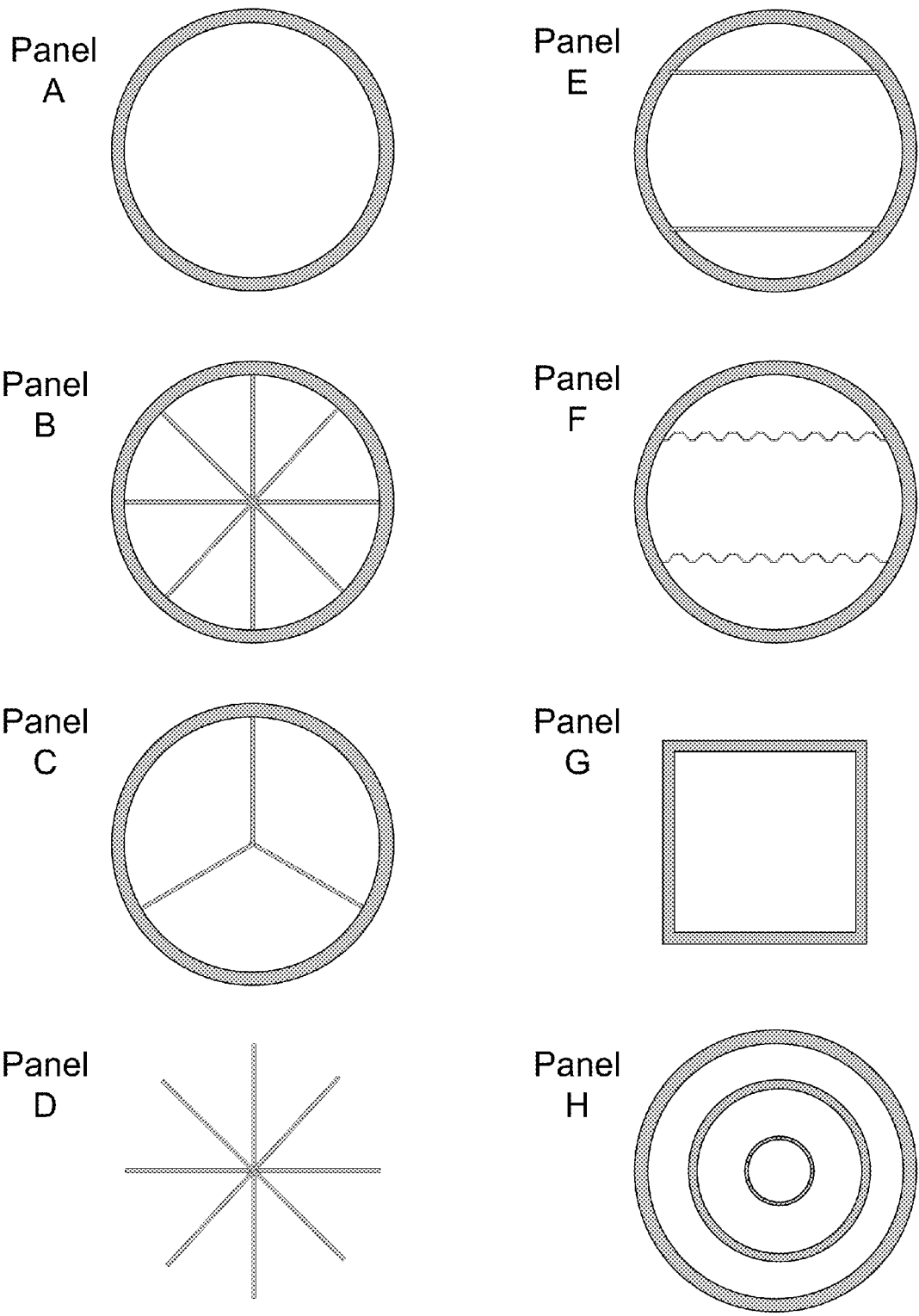
FIG. 3 panels A-H show examples of various possible shapes that may be used for inter-electrode structures in an electrode assembly according to some embodiments.

FIG. 3 presents top-down views of various possible inter-electrode structures that may be used in an electrode assembly according to certain embodiments such as the one presented in FIG. 2. As shown in panels A-G of FIG. 3, many different shapes may be used. In panel A, a simple ring is used. In some cases, particularly where relatively thinner electrodes are used, a simple ring may be inadequate to prevent bowing of the electrodes. An electrode that bows when installed will not function to effectively aim the ions onto the substrate as desired. Instead, the ion trajectories will be skewed. Therefore, in various embodiments additional support (which may be the same material as the ring) may be added to the inter-electrode structure. In panels B and C, for instance, radial supports are added. Any number of radial supports may be used. In panel D, the radial supports shown in panel B constitute the entire inter-electrode structure and no peripheral ring is used. Similarly, the peripheral ring may be omitted from any of the designs shown in panels C, E, F, and H, as well. The inter-electrode structure shown in panel E includes two supports that form chords across a peripheral ring. Any number of chords may be used. The supports may also be curved or waved when viewed from above. In panel F, the supports have a corrugated shape when viewed from above. The corrugated (or curved/waved) support may be configured to fit between apertures when considering a single electrode. In panel G, the inter-electrode structure is square shaped. The square structure may also be modified to include additional supports as shown in the other panels of FIG. 3. In panel H, a series of three concentric inter-electrode structures is used. Any number of individual inter-electrode structures may be used between each set of electrodes. In a related embodiment, the concentric structures may be attached to one another, for example by radial supports. In such a case, the inter-electrode structure may resemble a spider web. One of ordinary skill in the art would understand that the structures provided in FIG. 3 represent only a fraction of possible structures. Many modifications are available without departing from the contemplated embodiments.

In various cases, the inter-electrode structures may be designed such that they do not block any apertures. This type of design may involve carefully controlling where the inter-electrode structure is located to ensure that the structure is not placed where apertures are to be formed. In other implementations, overlap of apertures and inter-electrode structures is not problematic because the inter-electrode structures are etched along with the electrodes during aperture formation. In this case, any inter-electrode structure material that would block the apertures is no longer present after the apertures are formed. Such processing methods are discussed further below.

The material used to make the inter-electrode structures can be any rigid or somewhat rigid, moderate to high resistance material. For example, the inter-electrode structures may be made from silicon dioxide (e.g., fused silica, borosilicate glass, leaded glass, etc.), or from a ceramic (e.g., silicon carbide, silicon nitride, zirconia, alumina, cordierite, aluminum nitride, a cermet, a perovskite, a titanate, a zirconate, lithium-alumino-silicate or combination thereof), a machinable ceramic such as Macor® available from Corning Inc. of Corning, N.Y., or from a polymer such as an epoxy, polyimide, polyamide, etc.

The inter-electrode structure may have a height (sometimes referred to as a thickness) between about 0.5 mm-10 cm, for example between about 0.5 mm-5 cm, or between about 0.7 mm-2 cm. The height/thickness of the inter-electrode structure defines the separation distance between adjacent electrodes. In various cases two inter-electrode structures are used. A first inter-electrode structure separates the extraction electrode from the focus electrode, and a second inter-electrode structure separates the focus electrode from the lower electrode. The first and second inter-electrode structures may have the same height such that the separation between each set of electrodes is equal. In other cases, the inter-electrode structures may have unequal height such that the distance between the extraction electrode and the focus electrode is either larger or smaller than the distance between the focus electrode and the lower electrode. The distance between electrodes (and the height of the inter-electrode structures) may be unequal to promote particular lensing patterns (i.e., collimation) and ion collection in/through the electrode assembly. In some embodiments, the inter-electrode structures may have a perimeter that is about coextensive with the perimeters of the electrodes, as shown in FIG. 2. In other embodiments, the inter-electrode material perimeter may be smaller than the perimeters of the electrodes, for example to facilitate electrical connections to the electrodes.

Figure 4:
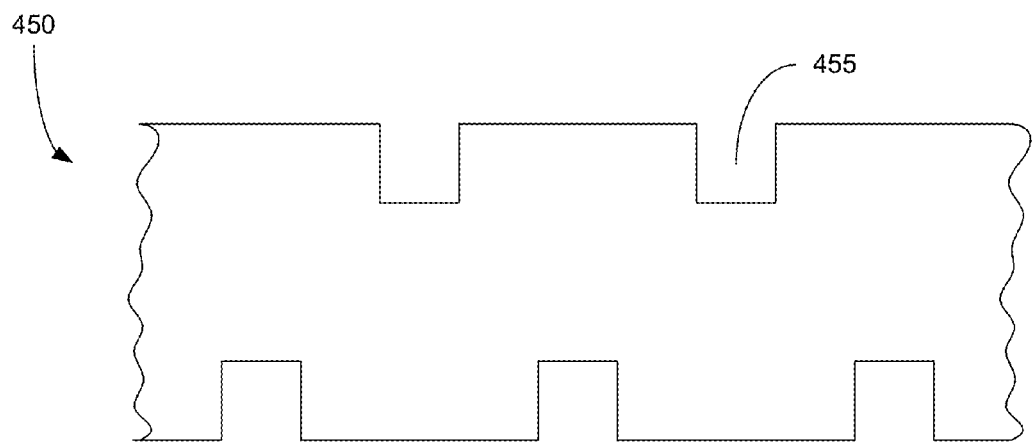
FIG. 4 depicts a cross-sectional view of a portion of an inter-electrode structure.

FIG. 4 presents a close-up view of a portion of an inter-electrode structure 450. While FIG. 3 presents a top-down view of an inter-electrode structure, FIG. 4 presents a side view. The portion shown in FIG. 4 may correspond to any part of the inter-electrode structure, for example a peripheral ring, or an additional support such as a radial support, chord, rib, etc. The portion may be curved or straight, as appropriate. The aperture formation or assembly and bonding processes may result in significant heating. The heating can cause expansion of gases and an increase in pressure where the expanded gases do not have an easy route for removal. Additionally when the environment around the electrode assembly is evacuated or pressurized as would occur during system start-up or for maintenance, large pressures differences across the electrode assembly may occur. For example, gas present in the space between adjacent electrodes can expand during vacuum pumping of the assembly, resulting in increased pressure between the electrodes. Such pressure increases can be dangerous and should be avoided. As such, in various cases the inter-electrode structure 450 may include gas pathways 455 configured to allow gas to escape from the spaces between adjacent electrodes. The gas pathways 455 may be provided at any appropriate dimensions and patterns. The gas pathways 455 should be sufficiently large to allow gas to escape without significant pressure buildup, but should not be so large or closely spaced to compromise the structural integrity of the inter-electrode structure 450.

In many cases, the inter-electrode structure may be formed/shaped before it is attached to the electrodes. In other cases, however, the shape of the inter-electrode structure is formed after the inter-electrode structure is attached to the electrodes. Such shaping may occur both during and after formation of the apertures.

Figure 5A:
FIGS. 5A-5D illustrate steps in forming an electrode assembly according to certain implementations.
Figure 5B:
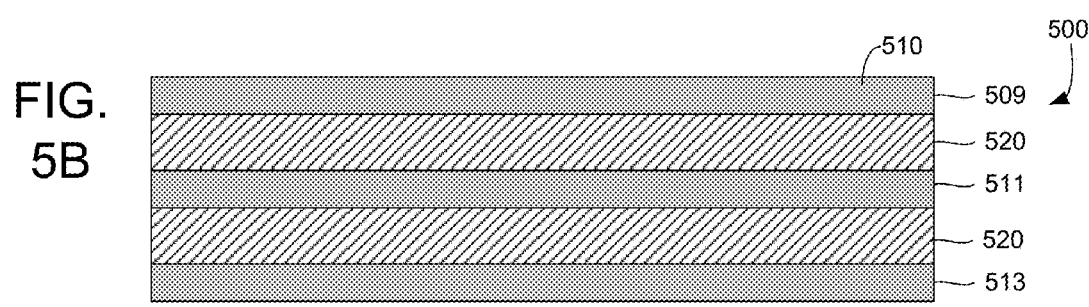
Figure 5C:
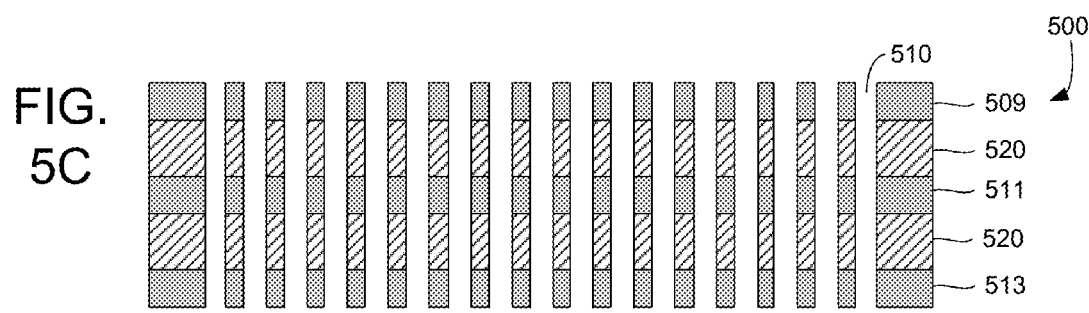

FIGS. 5A-5D present cross-sectional views of an electrode assembly 500 at different points in time during fabrication. Initially, an extraction electrode 509, a focus electrode 511 and a lower electrode 513 are provided without any apertures therein. An inter-electrode layer 520 is provided between each set of adjacent electrodes. The inter-electrode layer 520 may be pre-formed (as shown in FIG. 5A), or it may be deposited directly on the electrodes 509, 511, and/or 513 (e.g., through physical vapor deposition, a chemical vapor deposition, sol-gel deposition, spraying, or lamination). The inter-electrode layer 520 may also be referred to as an inter-electrode structure or inter-electrode material. Next, the inter-electrode layers 520 are connected to the electrodes to produce electrode assembly 500, as shown in FIG. 5B. The layers may be connected by electrostatic bonding in some cases. In other cases, glass frits may be used to bond the layers. In other cases, mechanical structures and/or adhesives are used to secure the layers in place. Electrostatic and mechanical bonding methods are further discussed below. After the electrodes 509, 511, and 513 are secured to the inter-electrode layers 520, apertures 510 are drilled into the electrode assembly as shown in FIG. 5C. The apertures may be formed through laser drilling (e.g., with a $CO_2$, UV or DPSS laser). mechanical drilling (e.g. using a diamond-tipped drill) or other drilling process. Next, the electrode assembly may be exposed to etching chemistry to etch away at least some of the remaining inter-electrode material between apertures in the inter-electrode layers 520. The etching chemistry should be chosen such that it selectively etches the inter-electrode material while leaving the electrode material relatively un-etched. One example chemistry that may be used to etch quartz inter-electrode material without etching a silicon-based electrode is hydrofluoric acid. Other etching chemistries that may be used in certain embodiments include BHF, BOE, HCL, $NHO_3$, Acetic Acid, KOH, $H_2N_2$, NaOH, $NH_4OH$, $N_2H_4$, Acetone or other ketones, Methylene Chloride, Alcohols, TMAH, and combinations thereof.

Figure 5D:
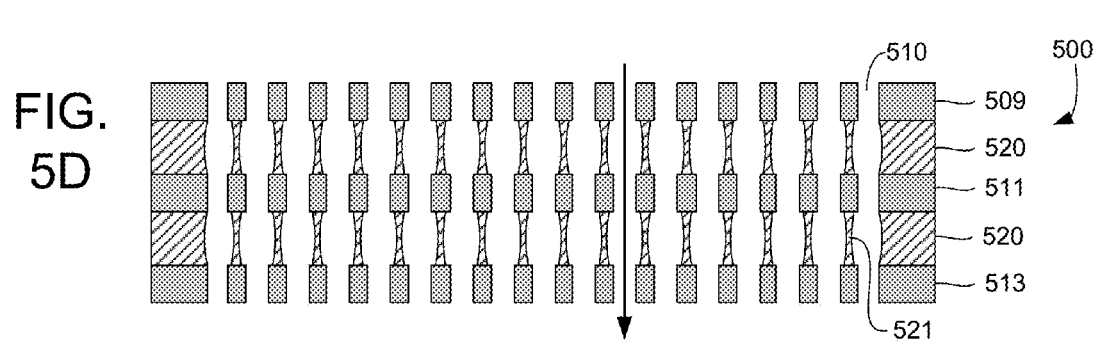

In FIG. 5D, the inter-electrode material is not completely etched away. Rather, the inter-electrode material is etched into support shapes 521. The support shapes 521 extend between sets of adjacent electrodes to contact each electrode in the set. When considered in three dimensions, the support shapes 521 may be separate individual columns (where etching is more extensive), or the shapes may remain joined to form a support network (where etching is less extensive). The arrow in FIG. 5D represents the trajectory of an ion through an aperture 510 of the electrode assembly 500.

In order for the electrodes to function as desired, the inter-electrode material should not deleteriously interfere with the electric fields/ion trajectories produced by the electrodes. Etching the inter-electrode material back from the edges of the apertures helps ensure that the electrodes function as desired, accelerating and focusing ions without arcing or shorting. Etching the inter-electrode material may be done to any desired degree. For example, in some cases the inter-electrode material is substantially entirely etched away except in a peripheral region. In this embodiment, the inter-electrode layer has a ring shape as shown in panel A of FIG. 3. In other embodiments, a minimal amount of inter-electrode material is etched away (e.g., the minimum amount needed for the electrodes to shape ion trajectories as desired).

The degree to which the inter-electrode material is etched depends on the duration of etching, the strength of the etching solution, and the relative geometry of the apertures that are formed in the electrodes. Longer etching and stronger etching solutions result in a greater degree of etching and therefore less extensive support shapes. Smaller distances between nearby apertures similarly results in a greater degree of etching and less extensive support shapes. There is a tradeoff associated with the degree to which the inter-electrode material is etched away. On one hand, etching a substantial amount of inter-electrode material helps ensure that the inter-electrode material does not interfere with the electric fields/ion trajectories produced by the electrodes. On the other hand, etching a small amount of inter-electrode material helps maintain the structural support provided by the inter-electrode material. As mentioned above, where the electrodes are insufficiently rigid, additional inter-electrode material supports can help ensure that the electrodes remain flat during processing.

In some implementations, it may be desirable to allow the inter-electrode material to be slightly conductive. This allows the inter-electrode material to bleed off charge in a controlled manner. For example glasses used to fabricate the inter-electrode material can be made slightly conductive by doping with metals such as In, Sn, Pb, Sb, etc.

The embodiment of FIGS. 5A-5D has several advantages. First, the electrode assembly produced is very strong and rigid due to the presence of many small inter-electrode material supports between neighboring electrodes. The electrodes are unlikely to bend or bow, even when very thin electrodes are used over a long time. This ensures that ions pass through the electrode assembly in a uniform and predictable manner. Another advantage of this embodiment is that material does not become trapped between electrode layers during formation of the apertures. In the embodiment of FIG. 2, for example, electrode material that is laser drilled (which may be in the form of dust) may become trapped between the extraction electrode 209 and the focus electrode 211, or between the focus electrode 211 and the lower electrode 213. This dust may need to be removed before installing the electrode assembly in a reaction chamber. The removal may involve, for example, a wet bath (e.g., in HF, other acids, alcohols, ketones, deionized water, and combinations thereof), or a gas flushing operation. Where the inter-electrode structure is instead implemented as a solid layer of inter-electrode material, there is no place for the dust to become trapped, except the aperture sidewalls. Further, any dust which sticks to the sidewalls of the apertures is removed when the inter-electrode material is etched back.

Figure 6A:
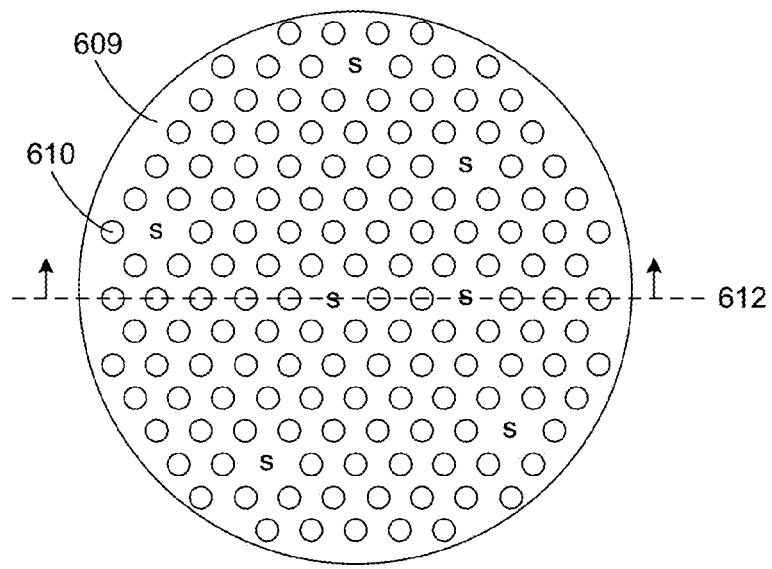
FIG. 6A illustrates a top-down view of an electrode having a number of apertures omitted for the purpose of providing increased structural support to the electrode assembly.
Figure 6B:
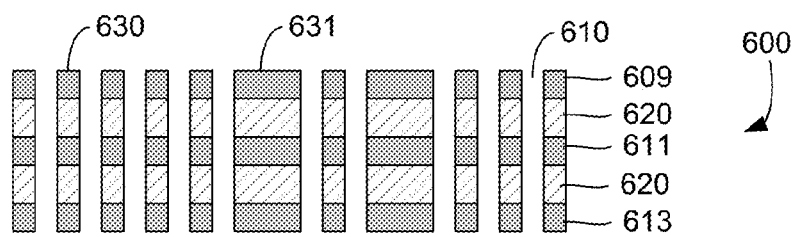
FIGS. 6B and 6C show cross-sectional views of an electrode assembly at different points during formation using electrodes having the shape shown in FIG. 6A.
Figure 6C:
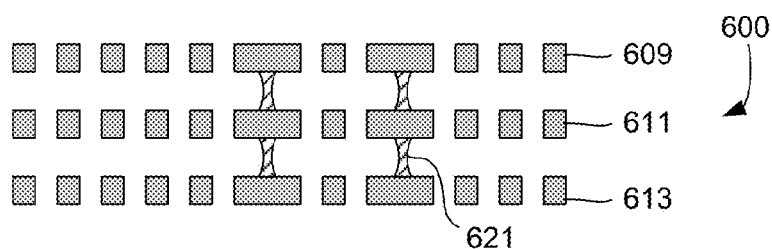

As mentioned, the degree of etching is affected not only by the duration of etching and the strength of the etching chemistry, but also by the relative geometries of the apertures in the electrodes. FIGS. 6A-6C depict an electrode and electrode assembly according to a particular embodiment. In this example, certain apertures are omitted such that the electrode assembly 600 formed has a relatively small number of support shapes 621 after etching. FIG. 6A shows a top-down view of an electrode 609 having apertures 610 arranged in a hexagonal pattern. Certain apertures are omitted at positions labeled "s." The apertures that are omitted may be chosen to provide spatially uniform ion flux over time. The omitted apertures may be evenly distributed across each electrode. In some cases, rotation of the substrate helps average the effect from such omitted apertures.

FIG. 6B presents a cross-sectional view of an electrode assembly 600 including an extraction electrode 609, a focus electrode 611, and a lower electrode 613, each having an aperture pattern as shown in FIG. 6A. Between each pair of adjacent electrodes is an inter-electrode material layer 620. FIG. 6B shows the electrode assembly after the apertures 610 are formed, but before the inter-electrode layer 620 is etched back. The electrode assembly 600 of FIGS. 6B and 6C are shown along the cut 612 shown in FIG. 6A. As shown in FIG. 6B, areas of the electrode 609 where apertures are regularly present produce relatively narrow between-aperture structures 630. Conversely, areas of the electrode 609 where apertures are omitted produce relatively thicker between-aperture structures 631. The between-aperture structures 630 and 631 each include the extraction electrode 609, the inter-electrode layer 620, the focus electrode 611, another inter-electrode layer 620, and the lower electrode 613.

FIG. 6C shows the electrode assembly 600 after the inter-electrode layer 620 is etched back. In areas where the apertures 610 were regularly present and relatively narrow between-aperture structures 630 were formed, the inter-electrode layer 620 is completely etched away. By contrast, in areas where apertures were omitted and relatively thicker between-aperture structures 631 were formed, the inter-electrode layer 620 is incompletely removed, and support shapes 621 remain. A support shape 621 may be formed at each "s" location of FIG. 6A where an aperture was omitted.

Gas pathways similar to those shown in FIG. 4 may be included in the inter-electrode layers of FIGS. 5B-D and FIGS. 6B-C. The gas pathways may be formed through laser drilling or through machining, for example using the same method used to drill the apertures in the electrode assemblies. The gas pathways may also be formed by pre-machining grooves into the inter-electrode material prior to assembly. In cases where the inter-electrode material is implemented as a structure (as in FIG. 3, for example), the gas pathways may be formed before the inter-electrode structure is joined to the electrodes to form the electrode assembly. It is also possible in such cases to form the gas pathways after assembly of the electrode assembly, but this may be more difficult. In cases where the inter-electrode material is implemented as a solid layer that is etched simultaneously with the electrodes, the gas pathways may be formed after the electrode assembly is joined together, either before or after formation of the apertures.

As mentioned above, electrostatic bonding may be used in some embodiments to join the electrodes to the inter-electrode material. Electrostatic bonding is also referred to as anodic bonding and field assisted bonding, and is often used to seal glass to silicon or metal. Briefly, electrostatic bonding involves joining a first material to a second material through application of heat and an electrostatic field. The first material may be the inter-electrode material (e.g., glass), and the second material may be the electrode (e.g., a silicon-based electrode). The glass may be provided as a pre-formed layer or structure, or it may be deposited (e.g., through sputtering, spin-on methods, or vapor deposition methods) directly on an electrode. The terms glass and inter-electrode material are used interchangeably in this section. Those of ordinary skill in the art understand that the term glass includes many different possible formulations. The electrostatic field allows creation of a space charge at the material interface, which creates a strong electrostatic attraction between the glass and the silicon. Further, oxygen is driven by the electric field from the glass to the glass-silicon interface, where it combines with silicon to form $SiO_2$, thus creating a strong permanent bond.

In order to perform electrostatic bonding, four basic steps are undertaken: (1) contacting the glass with the silicon-based electrode, (2) heating the glass and electrode, (3) applying an electrostatic field to bond the glass to the electrode and thereby form a glass-electrode stack, and (4) cooling down the glass-electrode stack. The bonding process is characterized by the bond voltage, and bond temperature. The bond voltage may be between about 100-10,000 V, for example between about 100-1000 V. The bond temperature may be between about 20-700° C., for example between about 100-500° C. The electrostatic bonding can occur at atmospheric pressure, however gas may become trapped at the interfaces, making voids in the bond. These voids may be prevented by performing the bonding in a vacuum environment. The vacuum environment may be between about $10^{-8}$ Torr and 100 Torr, for example between $10^{-5}$ Torr and $10^{-2}$ Torr.

Electrostatic bonding often results in bonds having a strength between about 10-20 MPa when subjected to pull tests. This strength is higher than the fracture strength of the glass in various cases. In other words, once the glass is electrostatically bonded, it may be easier to fracture the glass than to mechanically separate the glass from the electrode.

One consideration that is relevant when choosing the inter-electrode/glass material is the material's coefficient of thermal expansion (CTE). It is desirable for the inter-electrode material to have a CTE that approximates that of the electrodes. Where this is the case, both types of material will expand and contract in a similar manner when used in plasma processing. Otherwise, the materials may expand and contract non-uniformly, which can introduce tension/stress at the bond. Such stress can result in a poor quality bond. In some cases, the CTE of the inter-electrode material may differ from the CTE of the electrode material by no more than about 75%, in some cases by no more than about 15% in other cases by no more than about 10%. Such matching of the CTEs helps ensure a high quality bond. Some borosilicate glasses can be formulated to match the thermal expansion coefficient to silicon very closely. Some examples of CTE matched glasses are Hoya SD-2, from Hoya Corporation, of Tokyo, Japan, or Pyrex® 7740, from Corning Inc., of Corning, N.Y.

Another factor that affects the choice of inter-electrode material is the composition of such a material. As mentioned, the inter-electrode material may be glass in some cases, and various types of glass may be used. The glass may have a relatively high content of alkali metals (e.g., at least about 1% by weight, for example at least 2% or at least 3% by weight), in some cases. Pyrex borosilicate is one example, having a sodium oxide ($Na_2O$) content of about 3.5%. The presence of mobile metals within the glass is advantageous. The positive metal ions (e.g., Na+) are attracted to the negative electrode, where they are neutralized, by applying a high negative potential to the glass. This permits the formation of a space charge at the glass-silicon electrode interface, which in turn creates a strong electrostatic attraction between the silicon electrode and the glass. Heating the materials during bond formation helps increase the mobility of the positive ions.

Optically sensitive types of glass that may be used in certain cases include Foturan photosensitive glass (a photo structurable glass ceramic) manufactured by Schott Glass Corp. and distributed by Invenios of Santa Barbara, Calif. These materials can be exposed to light and preferentially etched away (where exposed). This could be used in combination with laser machining, where the electrodes are laser machined, while optically sensitive glass (i.e., the inter-electrode structure) is exposed to light either from a laser or from exposing the electrode stack to light (using the machined electrode as a shadow mask for the light). Once exposed, the glass is heated, and then the exposed regions are etched away using one or more of the appropriate glass etchants such as 2-7% dilute HF (by weight). The use of photosensitive glass eliminates the need for laser drilling which can be difficult for many glasses and fused silica.

In order to fabricate the electrode assembly as shown in FIG. 5B, for example, four bonds need to be created: (1) one bond between the lower surface of the extraction electrode 509 and the upper surface of the upper inter-electrode layer 520, (2) one bond between the lower surface of the upper inter-electrode layer 520 and the upper surface of the focus electrode 511, (3) one bond between the lower surface of the focus electrode and the upper surface of the lower inter-electrode layer 520, and (4) one bond between the lower surface of the lower inter-electrode layer 520 and the upper surface of the lower electrode 513. In some embodiments, each of these bonds is individually formed. In other cases, two or more of the bonds, for example all of the bonds, are formed simultaneously.

Figure 11:
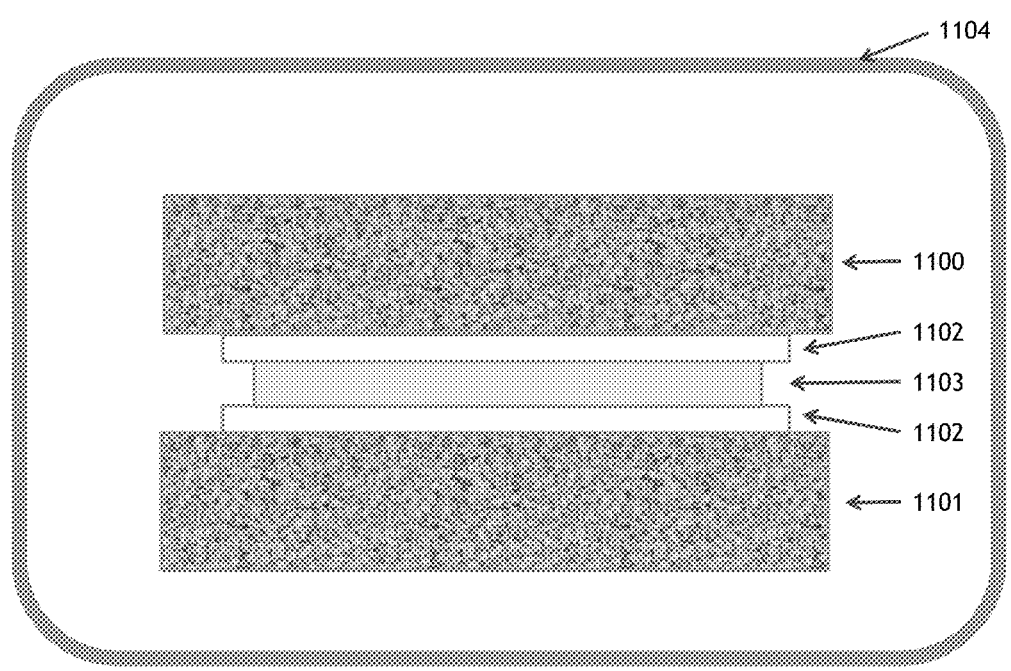
FIG. 11 shows two electrodes being secured together via an inter-electrode material using electrostatic bonding.

An example process for forming the electrode assembly is shown in FIG. 11. Electrodes 1102 and inter-electrode layer 1103 are cleaned and placed onto a heated platen 1101 inside vacuum vessel 1104. A heated pressure plate 1100 is placed on the electrode/inter-electrode material stack and the air in vacuum vessel 1104 is evacuated. Pressure is applied to heated pressure plate 1100, and a voltage is applied between the two electrodes 1102, either by making direct contact to the electrodes 1102 or by applying a voltage between the heated platen 1101 and the heated pressure plate 1100. The voltage and temperature are applied for a given time or until the current density drops to a set value. The process can then be repeated to add other electrodes and inter-electrode materials as desired.

Figure 7A:
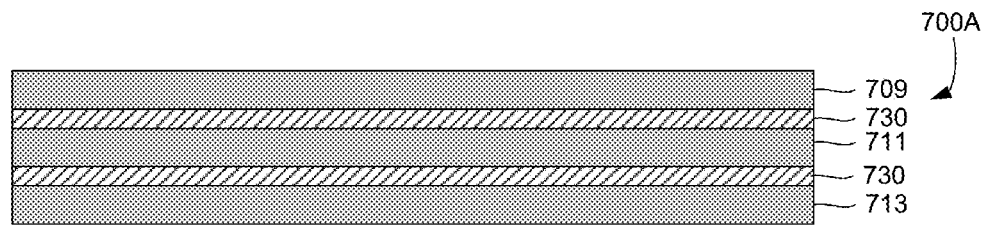
FIGS. 7A-7D depict various ways of securing an electrode assembly together according to some embodiments.
Figure 7B:
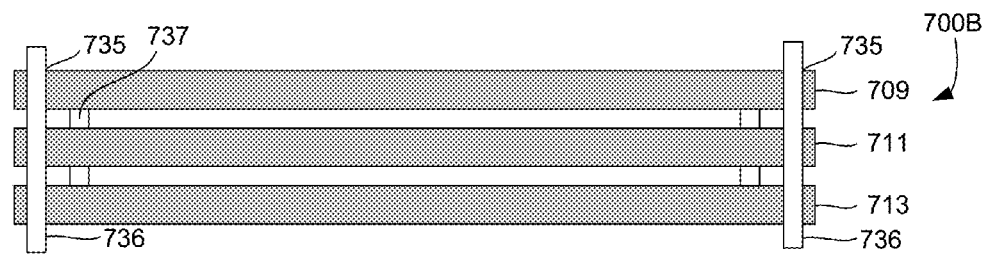
Figure 7C:
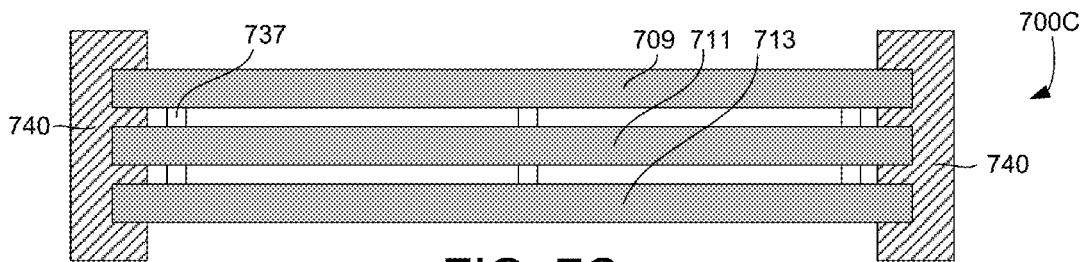

In other embodiments, the electrodes may be mechanically secured together without electrostatic bonding. Example mechanical joining methods are shown in FIGS. 7A-7C. The approaches outlined in these figures may also be combined with one another. Mechanical joining methods may be particularly advantageous for electrodes made from refractory materials. One type of mechanical joining method involves applying an adhesive or glass fits between the electrodes to secure the electrodes together. FIG. 7A illustrates this approach. In this case, electrode assembly 700A includes extraction electrode 709, focus electrode 711, lower electrode 713, and adhesive layers 730. Example adhesives include, but are not limited to, glass frits, epoxies, or other thermo-setting or thermo-plastic polymers, eutectic bonding materials, solders, and may include Pb-Based Glass Frits, B-Based Glass Frits, B—P-based glass fits, epoxies, silicones, polyimides, etc.

Another type of mechanical joining method involves cutting one or more guide holes into each of the electrodes, and inserting a pin or other structure through each of the guide holes to align the electrodes. FIG. 7B illustrates this approach. Here, electrode assembly 700B includes the electrodes 709, 711, and 713 mentioned above, as well as pins 736 and electrode spacers 737. The pins 736 fit in guide holes 735 in each of the electrodes. The pins 736 should fit relatively tightly in the guide holes 735 to prevent the electrodes 709, 711 and 713 from moving with respect to one another. The electrode spacers 737 may be provided to maintain the proper distance of separation between adjacent electrodes. The electrode spacers 737 may be of any shape (e.g., blocks, rings, etc.), and should be provided in a quantity sufficient to maintain the electrodes in a flat shape during drilling. The electrode spacers 737 may be provided radially interior of the pins 736, as shown in FIG. 7B, or they may be provided outside of the pins 736 if the electrodes are sufficiently rigid. In some cases, the guide holes 735 may be apertures through which ions travel during processing. Notably, only a small number of guide holes 735 need to be drilled before the electrode assembly 700B is put together and the remaining apertures are formed. The pins 736 may be removed before or after the electrodes are installed in a reaction chamber. Post-installation removal can help ensure that the electrodes are installed with the apertures fully aligned. In some designs, the pins 736 remain in the electrode assembly 700B, and the entire electrode assembly 700B is installed in, and remains in, the reaction chamber. In such cases, the choice of pin material is more important (the material should be insulating so that different levels of bias can be applied to each electrode).

A further type of mechanical alignment involves positioning (and securing) a first electrode on a precision optical table controlled by a laser interferometer measurement system and optically or mechanically measuring the position of one or more apertures or reference marks etched or machined into the electrode (e.g., such marks being positioned where an aperture is desired). Then one inter-electrode material is placed on top of the first electrode and positioned relative the first electrode by measuring the position of one or more apertures or reference marks optically or mechanically with reference to the measurements of the corresponding marks on the first electrode. Once aligned to the precision necessary, the inter-electrode material is clamped to the first electrode. Next, a second electrode is positioned relative to the first electrode in the same manner, and so forth until the entire electrode stack is aligned and clamped. After clamping, the assembly may be further bonded using glues. frits or anodic bonding.

A further type of mechanical joining method is shown in FIG. 7C. The electrode assembly 700C includes the electrodes 709, 711, and 713 as described above. However, in this example the electrodes are separated by brackets 740. The bracket 740 may be a mechanical alignment bracket of any suitable shape. Thus, there is no need to drill guide holes in this case. The brackets may be of any appropriate design. In the example of FIG. 7C, the brackets individually support each electrode by extending around the peripheral edge of each electrode. Electrode spacers 737 may be used to help support the electrodes and ensure that they remain flat during drilling. Any number of brackets may be used. For instance, a single bracket may be used in some examples. Where this is the case, the bracket may extend around a substantial portion of the periphery (e.g., the entire periphery, or at least about 90%, or at least about 95% of the entire periphery). The bracket may be flexible, or may include a joint that allows the electrodes to be placed into the bracket. In other cases, two or more brackets may be used. The brackets may be relatively small (e.g., each bracket supporting the electrodes at one narrow angular spot) or relatively large (e.g., each bracket extends around the periphery to some degree to support the electrodes at a wider angular position, up to about 180° per bracket where two brackets are used). Overall, the brackets may wholly or partially support the electrodes at their periphery. Where multiple brackets are used, the brackets may fit/snap/otherwise be secured together to provide additional mechanical stability to the electrode assembly 700C. The brackets 740 may be removed before or during installation in the reaction chamber, or they may remain connected to the electrodes during installation and processing. As with the pins 736 of FIG. 7B, the brackets should be insulating if they are to remain installed during operation. Further, if the brackets are present during processing and are shaped to support the entire periphery of the electrodes, the brackets may include pass-throughs allowing for an electrical connection to each electrode (for applying the bias to each electrode).

Figure 7D:
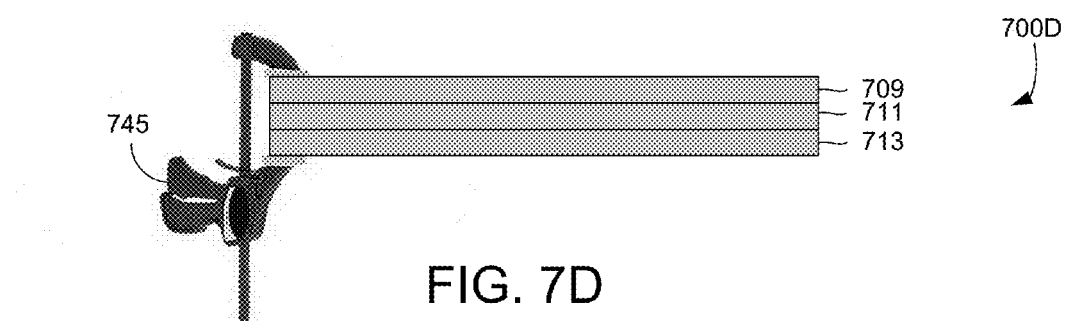

Another type of mechanical joining method involves the use of clamps, as shown in FIG. 7D. Here, the electrodes 709, 711, and 713 are sandwiched directly against one another (though additional spacers may be used to separate the electrodes if desired). A clamp 745 is provided to secure the electrodes against one another. Any number of clamps 745 may be used, with higher numbers of clamps providing additional mechanical security. Only a single clamp 745 is shown in FIG. 7D for the sake of clarity.

The embodiments of FIGS. 7B-7C may also be modified such that the electrodes 709, 711 and 713 are directly in contact with one another, without any spacers between them during aperture formation. It is not necessary to maintain space between the electrodes while the apertures are being formed. On the other hand, such space is necessary during processing. As such, where this is the case the electrodes should be separated and installed individually after the apertures are formed. This embodiment still varies from what is found in the prior art because apertures are formed in each of the electrodes simultaneously in a single unified process and in an extremely aligned manner. In any implementation where electrodes are installed individually after aperture formation, the apertures may be aligned by a laser or through other optical methods.

Regardless of the method is used to join the electrodes into an electrode assembly, the apertures may be formed after such assembly is joined together. The apertures may be formed by laser drilling in some cases. Laser drilling may occur through melting and/or vaporization of the workpiece material (i.e., the electrode) through absorption of energy from a focused laser beam. In some cases, a high power industrial laser is used, such as a $CO_2$ laser, UV Laser or DPSS laser.

In certain embodiments, laser drilling at full power results in unacceptable temperature increases, inter-electrode material fracture, or excessive hole taper. To address this issue and allow for cooling, the laser may be pulsed during drilling. The pulsing may reduce the degree of heating and therefore improve the drilling results. Example peak power levels delivered by a laser drill may range between about 50-5000 µJ/pulse, for example between about 200-500 µJ/pulse. Where the laser is pulsed, the frequency of such pulsing may be between about 25-500 kHz, for example between about 20-200 kHz. The duration of each pulse may be between about 1-50 µs, for example between about 5-20 µs. One of ordinary skill in the art would understand that the choice of laser and the choice of electrode and inter-electrode materials will affect the optimal power levels, pulsing frequency, pulse duration, duty cycle, etc. As such, the disclosed parameters are provided merely for guidance and are not intended to be exhaustive or limiting.

Laser drilling $SiO_2$-based inter-electrode materials (e.g., fused silica, or boro-silicate glasses, etc.) has several problems that a bonded electrode stack can overcome. Firstly, it is common that the laser-drilled exit hole experiences chipping and breakout on the underside due to acoustic shock during the drilling process. Since all inter-electrode materials are bonded between electrode materials in the bonded stack, chipping and breakout can be prevented. Secondly, micro-cracking can occur due to heat build-up in thick $SiO_2$-based materials. Since the inter-electrode material is bonded to thermally conductive electrodes, heat dissipation pathways are provided to minimize or prevent micro-cracking.

Depending on the configuration of the electrode assembly, the aperture formation process may involve drilling solely through electrode material, or through both electrode material and inter-electrode material. If the inter-electrode material is shaped and positioned such that it does not overlap with the apertures (as shown in FIG. 2), then the aperture formation process will only require drilling through the electrode material. On the other hand, where the inter-electrode material overlaps with the desired aperture positions (as shown in FIGS. 5B-5D and 6A-6C), the aperture formation process will require drilling through both the electrode material and the inter-electrode material.

In some cases, certain parameters are varied during the laser drilling process to account for the different materials being etched as the drilling process takes place. For example, the laser drilling process can be optimized for each material in the assembly by varying the laser's power, duty cycle, wavelength, pulse frequency, etc. These changes may be made to accommodate the various laser absorbance, reflectance, oblation temperature, and thermal conductivity properties of the different materials in the electrode assembly. Further, as mentioned above, in some cases a different type of process is used to drill through the electrodes vs. to drill through the inter-electrode material (e.g., where the inter-electrode material is a light sensitive glass).

Laser drilled holes in materials often have a taper that is typically larger on the laser entrance side and smaller on the laser exit side. This taper is commonly between about 2-10 degrees. Having a hole that is smaller on the plasma source side and larger downstream (i.e., the substrate-facing side) maybe advantageous in the electrode stack. This taper reduces the amount of ions that scatter off of electrodes and inter-electrode materials as they travel through the electrode stack. Therefore, it may be advantageous that the electrode stack be laser drilled from the ion exit side of the stack (i.e., the substrate-facing side of the electrode assembly). By laser drilling from this side, the desired taper can be accomplished.

In certain embodiments the apertures in the electrode stack get progressively larger, starting from the ion entrance side of the stack. The hole diameter in the electrode stack may increase 0-30% at each subsequent electrode (starting from the ion entrance side). For example the diameter may increase by 5-15% at each electrode, relative to the electrode before it. Appropriate aperture patterns and sizes are discussed above.

In certain embodiments, the apertures are formed by a lithographic process followed by an etch process. Since modern lithographic processes can precisely control size and position of the patterns, aperture alignment errors may be reduced significantly. Laser-based, direct-write lithography systems such as the DWL-400, from Heidelberg Instruments Mikrotechnik GmbH, of Heidelberg, Germany can position the aperture patterns to within 350 nm or better, and can produce aperture hole size precision of better than 120 nm. This is 500-1000× better than the precision that can be achieved by mechanical drilling. Other optical lithography systems such as scanners and step-and-repeat systems can produce similar or better performance. Once lithographic patterns are exposed and developed, these patterns can then be etched into the electrodes and inter-electrode materials separately. Since the aperture positional accuracy is very precise, aligning all of the apertures in the electrode stack, across all electrodes is possible.

Hollow Cathode Emitter

Any of the embodiments herein may be modified to include an additional electrode, which may be a hollow cathode emitter electrode. In certain embodiments, the hollow cathode emitter electrode is provided above the extraction electrode to create numerous high density ion sources above the extraction electrode. The hollow cathode emitter may be immediately above the extraction electrode in the same manner as the extraction electrode is immediately above the focus electrode (e.g., with no other intervening structures besides an optional inter-electrode material as described herein). In effect, each aperture in the hollow cathode emitter electrode acts as hollow cathode emitter, thereby providing numerous local high density ion sources. In other embodiments the hollow-cathode emitter may be incorporated within the extraction electrode itself. The apertures in the hollow cathode emitter electrode are designed or configured to be aligned with the apertures in the other electrodes. The hollow cathode emitter electrode therefore increases the efficiency of active ion generation, as a substantial majority of the ions generated in the hollow cathode emitters are successfully transferred through the electrodes to the wafer. This allows for high density ion generation at lower energy levels. Comparatively, where an ICP plasma source or other full-wafer (i.e., non-local) plasma source is used, much of the energy used in generating ions may be effectively wasted because many of the generated ions strike an upper surface of the electrodes. These ions therefore do not travel through the electrodes, and do not interact with the wafer.

Hollow cathodes typically include a conductive tube/cylinder having an emitter material on the inside surface. In the context of a hollow cathode emitter electrode, the conductive tubes/cylinders are the apertures. The emitter material preferably has a low work function, which allows the material to have a high secondary electron yield. Example emitter materials include, but are not limited to, silicon, tungsten, molybdenum, rhenium, osmium, tantalum, aluminum, titanium, and thoriated tungsten. The emitter may also be coated with a material to enhance secondary electron yield, or prevent corrosion to sputtering. This coating may be vapor deposited, sprayed on, electroplated, electro-less plated, chemical vapor deposited, plasma enhanced chemically vapor deposited, painted on, spun on, etc. Additionally the electrode material may be anodized. Typically, the electrode contains only a single material; in other words, the emitter material is the electrode material. The overall shape (e.g., thickness, diameter) of the hollow cathode emitter electrode may be substantially the same as the shape of the other electrodes. During etching, gas and/or plasma may be fed/generated upstream of the hollow cathode emitter electrode. Where plasma is generated upstream from the hollow cathode emitter electrode, such plasma may be an inductively coupled plasma, a capacitively coupled plasma, a transformer coupled plasma, a microwave plasma, etc. The plasma may be generated remotely or in the reaction chamber above the hollow cathode emitter electrode. The hollow cathode emitter electrode may be RF biased, for example between about 50-5,000 W, assuming a single 300 mm substrate is present. Emitted electrons ionize the gas in each aperture as the gas travels through hollow cathode emitter electrode. The ionization mechanism is discussed further below with respect to FIG. 9.

In certain embodiments, apertures of the hollow cathode emitter electrode are configured to have a shape that promotes high density ion formation. One example shape that achieves this purpose is a frustoconical aperture. Other shapes such as inverted cones, domes, inverted pyramids, etc. may also be used to promote ion formation. Generally, aperture shapes that are wider on the top compared to the bottom are especially useful.

In certain embodiments, it is desirable to have a gas pressure that is higher upstream of the hollow cathode emitter than downstream. To enable a pressure drop across the emitter, the gas conductance through the emitter holes should be low. In some cases the gas conductance through the electrode stack may be below about 10,000 L/min. For example the gas conductance may be between about 50-1000 L/min. For example, about a 1 Torr pressure differential (above vs. below the hollow cathode emitter) can be achieved by narrowing the minimum diameter (dimension $d_2$ in FIG. 8) of the aperture. For example, an array of 1000 apertures, with a $d_2$ diameter of 0.5 mm, and $d_3$ length 1 mm would have a gas conductance of about 800 L/min and would experience about a 1 Torr pressure drop when gas was flowing at about 1 SLM flow rate.

In embodiments where the gas conductance through the electrode assembly is reduced, a gas by-pass pathway may be used. This gas by-pass pathway would be opened to prevent excessive pressure differential across the electrode assembly, for example during initial pump down of the entire assembly. This gas by-pass then could be closed during operation if a pressure differential is desired.

Figure 8:
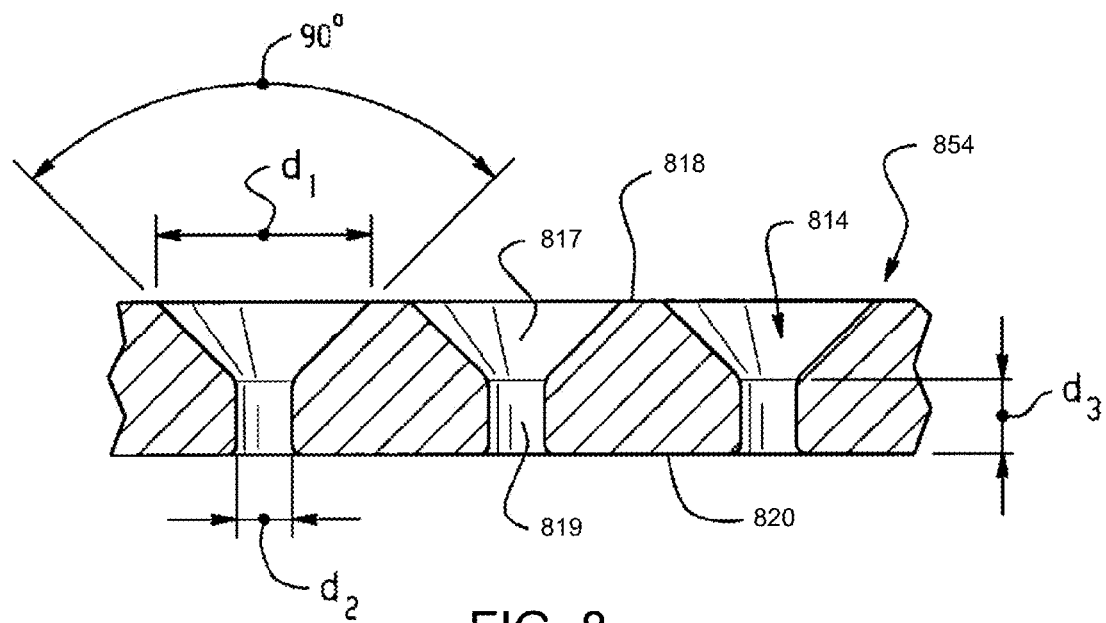
FIG. 8 shows a close-up cross-sectional view of a hollow cathode emitter electrode used in certain implementations.

FIG. 8 presents a close-up cross-sectional view of a hollow cathode emitter electrode 854 having frustoconically shaped apertures 814. Each aperture 814 has a first diameter $d_1$ on an upper surface 818 of hollow cathode emitter electrode 854 and a second diameter $d_2$ on a lower surface 820 (or wafer side) of hollow cathode emitter electrode 854. The first diameter $d_1$ is larger than the second diameter $d_2$. In some cases, the first diameter $d_1$ is between about 1 mm-20 cm. The second diameter $d_2$ may be between about 0.1 mm-10 cm. The ratio of the first diameter to the second diameter ($d_1/d_2$) may be between about 1.2-10. As can be seen, the upper side of the apertures 814 are generally frustoconical in shape, being tapered inward by a 90° chamfer until the interior diameter thereof is equal to $d_2$. The chamfer angle is measured as shown in FIG. 8. In other embodiments the conical section has a different chamfer angle, for example between about 45-120°. The frustoconical section meets the cylindrical section roughly halfway through the thickness of the hollow cathode emitter electrode 854, and thus apertures 814 may be characterized as having both a frustoconical section 817 and a cylindrical section 819. The cylindrical section 819 of aperture 814 has a height represented by $d_3$ in FIG. 8. In some cases, the height of the cylindrical section 819 is between about 0.2 mm-2 cm. In these or other cases, the height of the frustoconical section 817 is between about 0.5 mm-2 cm. The aperture diameters and heights herein, while shown in the context of an aperture having a frustoconical section and a cylindrical section, may also apply to apertures of different but similar shapes.

Figure 9:
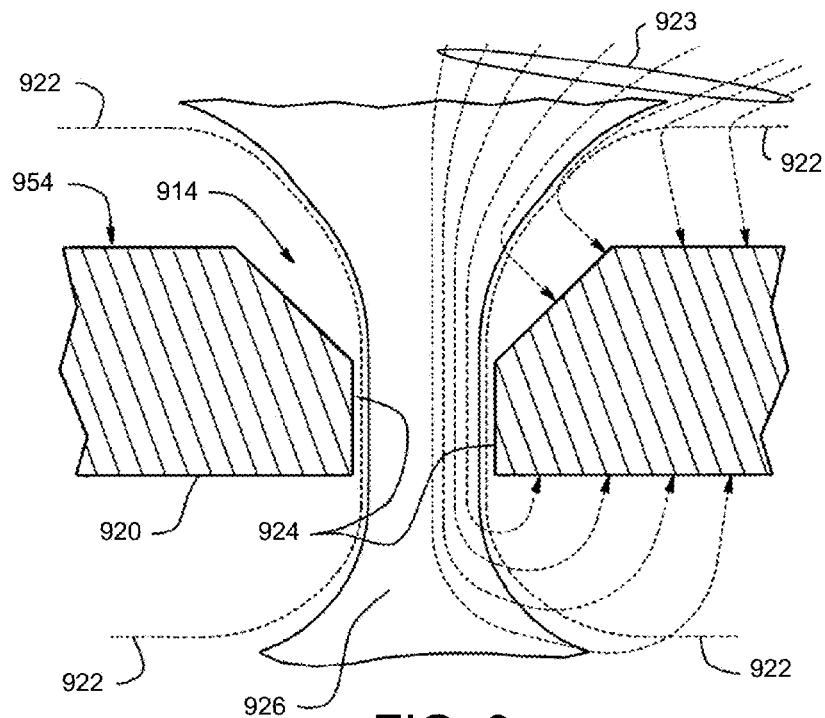
FIG. 9 illustrates formation of micro jets in a frustoconically shaped aperture of a hollow cathode emitter electrode.

FIG. 9 illustrates the micro-jet, low-energy ion generation region through the chamfered apertures 914 of the hollow cathode emitter electrode 954. As a result of the primary plasma discharge above the hollow cathode emitter electrode 954, a local sheath 922 is created in the apertures 914, thereby resulting in an electric field. The primary plasma discharge may be from any appropriate plasma source upstream of the hollow cathode emitter electrode 954. Example plasma sources include inductively coupled plasma sources, capacitively coupled plasma sources, microwave plasma sources, remote plasma sources, etc.

The electrons and ions from the primary discharge enter the apertures 914 and create a current path (indicated by dashed arrows 923) through each aperture and to the lower surface 920 of the hollow cathode emitter electrode 954. As the current lines (arrows 923) converge approaching the apertures 914, the current density increases, causing the formation of a denser plasma in the aperture, thereby forming the plasma jet which has a narrow plasma sheath. The increased plasma density of the microjet may also increase the neutral temperature which reduces the density of neutrals in the apertures. The combination of these effects may increase the electron temperature and change the chemistry of the discharge in the micro-jet. In addition, the ions are also accelerated by the sheath and strike the inner surface 924 of the apertures 914, thereby ejecting secondary electrons. The narrower sheaths associated with high plasma density plasma permit the acceleration of the electrons across the sheath 922 with few collisions resulting in the creation of very energetic electrons in the micro-jet. The secondary electrons gain enough energy so as to collide with neutral gas molecules, thereby ionizing them and creating a micro jet shaped discharge 926 through the apertures.

In some cases, the primary plasma discharge may be omitted. In other words, the hollow cathode emitter electrode may be the sole source of plasma/ions. In these embodiments, the initial high energy electrons that begin the cascade for ion formation are generated as a result of an RF bias applied to the hollow cathode emitter electrode. High voltage gradients and/or long apertures help promote formation of the micro-jets. These considerations are less important where high energy electrons are also being provided from a primary plasma upstream of the hollow cathode emitter electrode. Where no separate plasma source is included beyond the hollow cathode emitter electrode, the RF bias on the hollow cathode emitter electrode may be between about 500-10,000 W. Where a separate plasma source is included, the bias may be less extensive.

The micro-jet discharge 926 is the primary source of ions that ultimately impinge on the wafer. In addition, it has also been empirically determined that a low aspect ratio (diameter $d_2$ divided by height $d_3$) of the apertures 914 enhances the micro jet discharge. However, if the height of the apertures 914 (i.e., thickness of the hollow cathode emitter electrode 954) is made too small, the capacity for cooling of the electrode is eliminated. On the other hand, if the diameter of an aperture is made too large so as to lower the aspect ratio, the effectiveness of the hollow cathode emitter electrode in uniformly dispersing the plasma discharge is diminished. Accordingly, the apertures 914 of the present embodiments may be configured so as to provide a lower aspect ratio for effective generation and transport of an ion rich plasma, through the apertures to the wafer, while still allowing effective electrode cooling.

The sizing and aspect ratio of the apertures 914 needed to generate reliable micro jets therein is a function of the process conditions, including parameters such as plasma power, pressure, gas composition, etc. In this process, the "lighting" of micro jets in the apertures 914 is required to achieve uniform processing. The process described achieves the uniform and reliable lighting of the micro jets to produce such uniform processing. This differs from other applications, such as grids, in which a perforated plate used for shielding or generating/modulating electric or electro-magnetic fields has holes that do not reliably form micro jet discharges. Similarly, the present invention embodiments differ from other prior art where a perforated plate with holes is used as an electron or ion lens in which the plasma passes through the apertures in the plate without the formation of a micro jet discharge.

The use of a hollow cathode emitter electrode allows for high density ion extraction using relatively lower voltages/extraction fields. This may help reduce on-wafer damage from high energy ions. Where a hollow cathode emitter is used, it may be RF biased between about 100-10,000 W. In such cases, the extraction electrode may be biased between about 20-10,000 V with respect to the lower electrode, the focus electrode may be biased at an intermediate potential between the extraction electrode and the lower electrode, or a potential higher than the extraction electrode. The lower electrode may be grounded or biased relative to the level of the wafer, for example between about 0-negative 1,000 V relative to the substrate. A potential gradient between the extraction/focus/lower electrodes as installed may be between about 0-5,000 V/cm.

Reflector

Any of the embodiments herein may be modified to include a set of reflectors below the lower electrode. The reflectors may be used to neutralize the ion beam without the use of a costly flood gun. In particular, ions that impact the reflector surface pick up electrons to become neutral particles. Further, the reflectors may capture sputtered material, which may travel at relatively low kinetic energy and stick to the reflectors. In some cases, the reflectors are made from a material such as degeneratively doped silicon, metal foil or metal plate (e.g., silicon, tungsten, molybdenum, rhenium, osmium, tantalum, aluminum, titanium, or thoriated tungsten).

Figure 10:
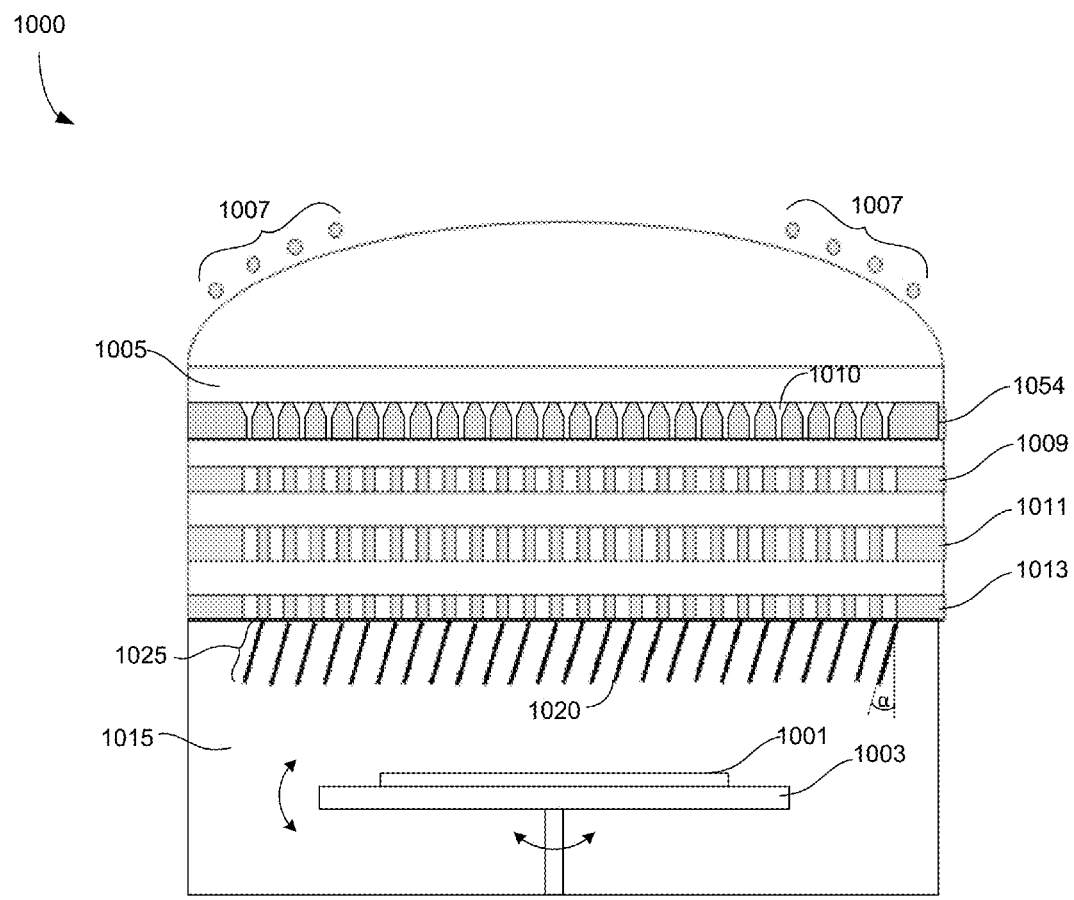
FIG. 10 shows a reaction chamber equipped with a reflector used to neutralize the ion beam in certain embodiments.

FIG. 10 illustrates a reaction chamber 1000 for performing ion beam etching. In this example, four electrodes are used including a hollow cathode emitter electrode 1054, an extraction electrode 1009, a focus electrode 1011, and a lower electrode 1013. As shown in FIG. 10, the apertures 1010 in the hollow cathode emitter electrode 1054 may have a frustoconical or other shape as described above. Below the lower electrode 1013, a set of reflectors 1020 are attached. The reflectors 1020 may have an angle $\alpha$ with respect to the surface normal of electrode 1013 between about 0.5-20°. The length of the reflectors 1025 may be sufficiently long to close off the apertures from a line-of-sight projection through the aperture holes onto the substrate. Therefore, the length 1025 may be greater than or equal to the diameter of the apertures in electrode 1013 divided by the sine of $\alpha$. The spacing between adjacent reflectors may be the same as the spacing between adjacent apertures. The reflectors are positioned parallel to one another such that they uniformly alter the ion trajectories. Because the reflectors 1020 change the trajectory of the ions/particles as they enter the substrate processing region 1015, the particles leaving the reflector 1020 do not travel straight downward. If it is desired that the particles impact the wafer 1001 at a normal angle (i.e., 90°), the wafer 1001 may be tilted to accommodate the angled trajectory of the particles. Tilting may be done by controlling the substrate support pedestal 1003. In some cases, the wafer may be tilted and untilted to various degrees during etching to direct the ions/particles as needed. In other cases the electrode assembly may be tilted with respect to the substrate. Tilting may help achieve good etching results at feature sidewalls, for example. Such tilting may occur regardless of whether a reflector 1020 is used.

The other features of FIG. 10 are similar to those shown in FIG. 1. For example, plasma is generated through the ICP plasma source 1007. The plasma is generated in a primary plasma generation region 1005.

The reflectors may be pre-formed and attached to an electrode assembly in some cases. The reflector formation process may involve shaping silicon or metal pieces into desired shapes. Alternatively or in addition, the reflector formation process may involve creation of apertures in a plate of material. Apertures may be formed through laser cutting or through the electrolytic bath/metal ball process described below.

In a particular embodiment, the reflectors may be formed at the same time or immediately following formation of the apertures in an electrode assembly. Metal balls (e.g., molybdenum or gold balls) may be used to form the apertures in some cases. A reflector precursor layer may be provided below the lower electrode. In some cases the reflector precursor layer is silicon (e.g., degeneratively doped silicon), which may be electrostatically bonded to the lower electrode. The reflector precursor layer may be a solid layer of material, without any apertures or other pathways. Once the entire electrode assembly is assembled with the reflector precursor layer attached, the assembly may be placed into an electrolytic bath. The electrodes may already have apertures drilled therein, or the electrode apertures may be formed in the electrolytic bath. The bath solution may include KOH, KOH+IPA, ethylenediamine, ethylenediamine+pyrocatechol, hydrazine, hydrofluoric acid, $H_2O_2$, or combinations thereof, for example. Metal balls may be placed on the assembly where the apertures are desired. In some cases the uppermost electrode (e.g., a hollow cathode emitter or an extraction electrode) includes pre-drilled divots or holes designed to hold/secure the metal balls in place where the apertures are desired. In one embodiment, the metal balls are chosen to have a catalytic reaction to the silicon. For example, silicon is etched in a solution of $HF+H_2O_2+H_2O$ in the presence of silver. Placing silver balls on the surface while immersing the electrode stack in the etchant solution will only etch the silicon where the balls contact the silicon surface. Other known metal catalysts include gold and platinum. An electric field may then be applied to cause the metal balls to cut through the electrode assembly. The apertures may be formed individually (e.g., using one metal ball at a time), in groups/waves, or all at once.

Gravity may play a role in this process, with the metal balls cutting through the electrode assembly material in a direction directly toward the center of the Earth. When the metal balls reach the interface between the lower electrode and the reflector precursor layer, the entire electrode assembly may be tilted. Tilting may also occur slightly before or after this interface is reached (e.g., when the balls are about halfway or more through the material). The metal balls continue to fall in a downward direction, cutting very straight apertures into the reflector precursor layer. The apertures in the reflector precursor layer are aligned with the apertures in the electrodes. However, there is not a direct line of sight through the electrodes and reflector layer due to the angle created at (or near) the interface between the lower electrode and the reflector layer.

The metal balls used to create the apertures may have a diameter between about 1 mm-5 cm. In some cases, a multistep process is used to create the apertures. The first step may involve creating small apertures with metal balls as discussed above (with or without a reflector being formed simultaneously). A second step may involve enlarging the apertures created in the first step, for example by laser drilling, diamond bit drilling, or other machining methods. The second step may be performed from either side of the electrode assembly (e.g., from the top and/or bottom). Care should be taken to ensure that the second step does not overly remove material at the interface between the lower electrode and the reflector layer (if present).

As mentioned, the metal ball aperture formation processes may also be used where the electrode assembly does not include any reflector. Further, the metal ball aperture formation process may be used to form apertures in a reflector that is not yet attached to an electrode assembly.

Chamber Liner

One issue that arises in certain etching operations is the deposition of undesirable particles on a substrate during etching. The particles may be sputtered off of internal reaction chamber surfaces, for example due to exposure to plasma. The particles then fall onto the surface of the substrate where they can cause defects.

In order to address this problem, any of the embodiments described herein may be modified to include a sputter-resistant chamber liner. The chamber liner helps minimize sputtering and therefore deposition of unwanted particles on a substrate during etching. The chamber liner may be removable in certain cases.

The material used for the chamber liner should be resistant to sputtering under the typical reaction conditions used in the reaction chamber. The chamber liner may have a sputtering yield of ≤0.2 for the ion and ion energy used. Example materials include carbon, silicon, titanium, molybdenum, tungsten, and tantalum.

The liner may be configured to be easily removed for cleaning or replacement.

The liner may cover the chamber walls and floor. In some cases, the liner is designed to leave certain surfaces exposed. These non-exposed surfaces may include the substrate, the electrodes, viewports, detector windows, in-situ detectors, charge neutralization heads, and the like. The liner may be designed to follow the contour of the various internal reaction chamber surfaces. In certain cases, a chamber liner may have a thickness between about 1 mm-3 cm, for example between about 2 mm-2 cm.

Substrate Rotation During Etching

In various embodiments, it may be beneficial to rotate and/or tilt the wafer during etching. Wafer rotation can help average the etching results over the face of the substrate, thereby promoting within-wafer uniformity. Wafer rotation may be achieved by rotating the support on which the substrate is positioned. This support is sometimes referred to as a pedestal, chuck, electrostatic chuck, substrate fixture, etc. Tilting the wafer during etching can be beneficial in controlling the etching profile, especially at the sidewalls of etched features. Tilting is similarly accomplished by tilting the substrate support. In some cases, tilting is done such that the ions/particles impact the substrate at an angle that is about 25° or less (e.g., about 5° or less) from a normal angle. In other cases, tilting may be 45° or less. In other cases, tilting may be more extensive, for example about 85° or less from a substrate normal angle.

The substrate support typically contains various electrical and fluidic connections. These connections may provide power, cooling fluids, etc. to the substrate support. The power and cooling fluids may originate from a position within the reaction chamber (such position being removed from the substrate support), or from a position outside of the reaction chamber. The electrical and fluidic connections render substrate rotation and tilting more difficult. For instance, a wire connected to the substrate support may wrap around the substrate support (e.g., around or within a stem of the support in some cases) as the substrate rotates during an etching process. This wraparound can quickly prevent further rotation of the substrate. Specialized seals may be provided in certain cases to allow the connections to rotate along with the substrate support. These seals accommodate the connections and prevent them from becoming tangled around the substrate support. However, these seals (sometimes referred to as rotating vacuum seals) are susceptible to leakage, making it difficult to maintain a desired low pressure within the reaction chamber. The seals require regular maintenance to address the leakage issues. As such, there is a need for an improved method of rotating the substrate during etching that accommodates the electrical and fluidic connections to the substrate support.

In certain implementations, substrate rotation may be accomplished in a multi-step cyclic process. A first step of the process involves rotating the substrate in a first direction (e.g., clockwise), and a second step involves rotating the substrate in a second direction (e.g., counterclockwise), opposite the first direction. By repeating these two steps and regularly rotating the substrate in each direction, the electrical and fluidic connections can be wound and unwound around the substrate support to a manageable degree. An appropriate and reasonable amount of slack may be provided in each connection made to the substrate support. For instance, electrical and fluidic connections may be provided with sufficient slack to permit the substrate to rotate a particular amount in either direction.

As used herein, the rotation configuration of a substrate support is measured from a central measuring point and is represented by both positive and negative values, depending on the direction of rotation (clockwise rotation being positive). A substrate support that is configured to rotating ±n degrees from the central measuring point is one that rotates 2n degrees in either direction overall. The factor of 2 is introduced due to the fact that the rotation is measured from the central measuring point, and the fact that the substrate can be rotated in either direction from this measuring point. For instance, a substrate support capable of rotating ±180° can actually rotate a full turn (360°) in either direction when considering the full range of motion (i.e., from one rotational extreme to the other). The following rotation pattern is given to further clarify how the rotation capability is measured and described herein. In this example, a substrate starts at a starting position and rotates +180° clockwise, then –360 degrees counterclockwise, then +360° clockwise, then –360° counterclockwise, etc. In each 360° rotation, the first 180° effectively undoes the previous rotation, and the second 180° continues rotating the substrate in the new direction. In this example, the starting position of the substrate corresponds to a rotation of 0°. Of course, the substrate may also start a process from other positions. In one example, the substrate starts at a starting position corresponding to a rotation of –180°, then rotates +360° clockwise, –360° counterclockwise, +360° clockwise, etc. In this example, only full turns are used. Both this and the previous example correspond to substrate supports that are configured to rotate ±180°.

In certain embodiments, the substrate support is designed or configured to rotate between about ±180° and ±215°, In another case, the substrate support may be designed or configured to rotate between about ±180°. The angular extent of rotation may be chosen to allow multi-directional ion bombardment without harming the electrical and fluidic lines connected to the substrate support. The angular extent of the rotation may be chosen based on the length and flexibility of the electrical and fluidic connections used. Longer and more flexible connections permit more extensive rotations. Where more extensive rotations are used, the extra connection length may be managed as described below.

While these angular ranges are disclosed with respect to a substrate support designed or configured to rotate as stated, those of ordinary skill in the art understand that various other components (e.g., the electrical and fluidic connections, a motor used to rotate the substrate support, etc.) are part of the configuration of the substrate support. In other words, the substrate support, electrical and fluidic connections to the substrate support, and any related structures may together be designed or configured to permit the rotations disclosed above. A controller may be used to control the rotation of the substrate support and substrate. The controller may have instructions to rotate the substrate according to any of the angular ranges or patterns disclosed herein.

In order to control the rotation angle, an indexing system may be used. Such a system may designate/define different angular locations on the substrate (e.g., 0°, 1°, . . . 359°), and track the rotation of the substrate according to these locations. The rotation may be tracked through optical means in some cases. For instance, a substrate holder may have a plurality of marks (e.g., 360 marks, each separated by 1°, though any suitable number of marks may be used) that can be tracked by an optical system as the substrate rotates. An optical encoder may be used in some cases. In other cases, a stepper motor is used to rotate the substrate. The stepper motor may rotate the substrate as described herein, carefully controlling the angular rotation of the substrate over time. A stepper motor may divide a full rotation into a number of equal steps (e.g., 360 steps, each separated by 1° or less, though any appropriate number of steps may be used). The motor's position, and therefore the angular position of the substrate holder and substrate, can be controlled to move between designated steps without the need for any feedback sensors. Other rotational indexing systems may also be used, so long as they allow the angular/rotational position to be accurately tracked at the relevant rotation speeds. Angular position tracking may be particularly beneficial for applications such as MRAM, and STT-RAM. For example, in MRAM and STT-RAM cases, there is an axis dependence in the magnetic moment. Such dependence makes angular control quite beneficial. In some cases such as 3D devices it may be beneficial to rotate the substrate in 180° steps, or in some cases 90° steps, or in other cases 45° steps, and in other cases 30° steps.

The electrical and fluidic lines may connect with the substrate support at various locations. Where the lines contact closer to the center of the substrate support, less slack is needed in the lines to accommodate rotation of the support. In some cases the electrical and fluidic lines pass upwards within or substantially within a central stem of the substrate support. This configuration may be beneficial in minimizing any effects related to having wires and other connections moving around the processing chamber during etching. Instead, movement of the electrical and fluidic connection lines is limited to the internal region of the stem of the substrate support. The connection lines should be sufficiently flexible to accommodate the movements.

In certain cases, a simple back-and-forth rotation of the substrate during etching results in a poor etching profile for etched features. The poor profile may result from ion directionality and the fact that the features are impacted somewhat unevenly as the substrate rotates back and forth. This problem is especially relevant when the ions/particles are directed at the substrate at a non-normal angle. For example, where non-normal incident ion beams are used in the context of a repeating +360°, –360° rotation pattern, a first side of a feature may be etched from the direction of the ion beam during two subsequent partial rotations (i.e., a portion of the clockwise rotation immediately before switching rotation direction and a portion of the counterclockwise rotation immediately after switching rotation direction) before the opposite side of the feature is exposed to the non-normal ion beam. This "double exposure" on the first side of the feature may not be precisely balanced out by the "double exposure" on the opposite side of the wafer that happens in subsequent rotations. The mismatch may occur for a variety of reasons including, for example, the changing feature shape (e.g., due to etching as well as redeposition of etching byproducts). The resulting etch profiles for vertical shapes may be bowed or "C" shaped in some cases.

In order to address these etching profile problems, the rate of rotation may be varied during etching. In one example, the substrate rotates slowly in one direction (e.g., clockwise) and quickly in the opposite direction (e.g., counterclockwise). An example rotation pattern may be: +360° (slow clockwise), −360° (fast counterclockwise), +360° (slow clockwise), −360° (fast counterclockwise), etc. In another example, the substrate rotates slowly during an initial portion of a rotation in one direction, and quickly during a final portion of the rotation in that direction (or vice versa). For instance, the substrate may rotate according to the following rotation pattern: +180° (slow clockwise), −180° (fast counterclockwise), −180° (slow counterclockwise), +180° (fast clockwise), etc. (repeating from the first step). Examples of slow rotation rates may be between about 1-10 RPM. Examples of fast rotation rates may be between about 10-500 RPM. The fast rotation rate may be faster than the slow rotation rate by a factor of at least about 5.

In other embodiments, the system may be designed or configured to minimize or stop the ion/particle flux during certain portions of the etching process, for example during periods where the substrate is rotating in a particular direction, or during certain portions (e.g., first half or second half) of each individual rotation. One example rotation pattern may be: +180° clockwise (with ion/particle flux impacting the wafer), −180° counterclockwise (with no ion/particle flux impacting the wafer), −180° counterclockwise (with ion/particle flux impacting the wafer), +180° clockwise (with no ion/particle flux impacting the wafer, etc. (repeating from the first step). A shutter may be used to control the flux delivered to the wafer. Alternatively or in addition, the plasma may be ignited and extinguished as needed to provide ions/particle flux to the wafer when desired. Alternatively the voltage to one or more of the electrodes may be rapidly switched to a different voltage that block the ions from reaching the substrate.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus used for performing the disclosed embodiments often includes a system controller having programming to control the etching process. The controller may execute system control software, which may be stored in a mass storage device, loaded into a memory device, and executed on a processor. The software may be transferred over a network in some cases. Various process tool component subroutines or control objects may be written to control operation of the process tool components necessary to carry out various process tool processes. The system control software may be coded in any suitable computer readable programming language. In some embodiments, the system control software may include input/output control (IOC) sequencing instructions for controlling the various parameters discussed herein. The system controller may also be associated with other computer software and/or programs, which may be stored on a mass storage device or memory device associated with the controller. Examples of programs or sections of programs for this purpose include a substrate positioning program, a plasma gas control program, a reactant gas control program, a pressure control program, a temperature control program, and a plasma control program.

A substrate positioning program may include code for process tool components that are used to load and unload the substrate onto the substrate support. A plasma gas control program may include code for controlling the composition and flow rates of gas(es) used to generate the plasma from which ions are extracted. A reactant gas control program may include code for controlling the composition, flow rate, and pressure at which other reactant gases are delivered. A pressure control program may include code for controlling the pressure at which individual reactants are delivered, the pressure at which reactants are removed, and the pressure at which the substrate processing region is maintained. A temperature control program may include code for controlling heating and/or cooling equipment used to maintain the substrate, substrate support, and/or substrate processing region at a particular temperature. A plasma control program may include code for generating the plasma at certain powers and frequencies.

The system control software may include instructions for delivering reactants at the flow rates and/or pressures disclosed herein. Such instructions may relate to delivery of a gas used to generate plasma (from which ions are extracted), or they may relate to delivery of one or more gases provided separately (i.e., not used to generate plasma).

The system control software may further include instructions for maintaining the substrate processing region at a certain pressure. The system control software also typically includes instructions for controlling the timing of the etching process. In many cases the controller also controls the bias applied to each of the electrodes. As such, the system control software may include instructions for applying a first bias to the extraction electrode, a second bias to the focus electrode, a third bias (or ground conditions) to the lower electrode and substrate/substrate support, and a fourth bias to the hollow cathode emitter electrode. In some embodiments, the instructions further include maintaining the substrate and/or substrate processing region at a particular temperature through heating or cooling.

Where a shutter is used to modulate ion flux, the system control software may include instructions to modulate the ions by opening and closing the shutter at desired times (e.g., during particular portions of the rotation pattern as described above). In a particular embodiment, the software includes instructions to open the shutters (thereby allowing ions to impinge on the wafer surface) only when the substrate is rotating in a particular direction or at a particular speed.

With respect to plasma generation, the system control software may include instructions for providing a plasma generation gas at a particular flow rate, temperature, and/or pressure. The instructions may further relate to the amount of power (e.g., RF power) used to generate the plasma, and the frequency at which such power is delivered.

In some embodiments, a user interface may be associated with a system controller, the user interface may include a display screen, graphical software displays of the apparatus and/or process conditions, and user input devices such as pointing devices, keyboards, touch screens, microphones, etc.

In many embodiments, the system controller is used to adjust other process parameters. Such parameters may include, but are not limited to, reactant gas compositions, flow rates, and pressures, plasma generation gas composition, flow rates, and pressures, pressure in the substrate processing region, bias applied to the individual electrodes, temperature, plasma conditions (e.g., frequency and power), position of the wafer, etc.

Signals for monitoring the process may be provided by analog and/or digital input connections of the system controller from various process tool sensors. The signals for controlling the process may be output on the analog and digital output connections of the controller. Non-limiting examples of process tool sensors that may be monitored include mass flow controllers, pressure sensors, thermocouples, etc. Appropriately programmed feedback and control algorithms may be used with data from these sensors to maintain process conditions.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of making an electrode assembly for use in an ion beam etching reactor, the method comprising:
   providing a first electrode, a second electrode and a third electrode;
   providing and securing a first inter-electrode structure such that it is immobilized between the first electrode and the second electrode, and providing and securing a second inter-electrode structure such that it is immobilized between the second electrode and the third electrode, wherein the first electrode, second electrode, third electrode, first inter-electrode structure, and second inter-electrode structure are substantially vertically aligned with one another to form the electrode assembly; and
   forming a plurality of apertures in the first electrode, second electrode and third electrode while the first inter-electrode structure and the second inter-electrode structure are immobilized in the electrode assembly.

2. The method of claim 1, wherein securing one or more of the inter-electrode structures comprises providing an adhesive or glass frit to secure the one or more inter-electrode structures to one or more of the electrodes.

3. The method of claim 1, wherein securing the first inter-electrode structure and securing the second inter-electrode structure comprise providing brackets or clamps that directly or indirectly secure the first inter-electrode structure and the second inter-electrode structure and that directly secure at least the first electrode and the third electrode.

4. The method of claim 1, wherein the first, second and third electrodes and the first and second inter-electrode structures have coefficients of thermal expansion (CTE) that differ from one another by about 50% or less.

5. The method of claim 1, wherein forming the apertures comprises drilling the apertures with a laser.

6. The method of claim 1, wherein the apertures in the third electrode have a diameter that is between about 0-30% larger than a diameter of the apertures in the second electrode, and wherein the diameter of the apertures in the second electrode is between about 0-30% larger than a diameter of the apertures in the first electrode.

7. The method of claim 1, wherein one or more of the electrodes have apertures which are tapered at an angle of about 10° or less.

8. The method of claim 1, further comprising attaching a reflector to the third electrode, wherein the reflector blocks a direct line-of-sight through the electrode assembly.

9. The method of claim 1, further comprising forming gas pathways in the first inter-electrode structure and/or in the second inter-electrode structure, wherein the gas pathways allow gas to escape outwards from an interior region of the electrode assembly.

10. The method of claim 1, wherein one or more of the electrodes comprise degeneratively doped silicon, wherein securing the first inter-electrode structure comprises attaching the first inter-electrode structure to the first electrode and/or to the second electrode, and wherein securing the second inter-electrode structure comprises attaching the second inter-electrode structure to the second electrode and/or to the third electrode.

11. The method of claim 10, wherein securing one or more of the inter-electrode structures comprises electrostatically bonding one or more of the inter-electrode structures to at least one of the electrodes.

12. The method of claim 1, wherein forming apertures in first electrode, second electrode and third electrode further comprises forming apertures in the first inter-electrode material and in the second inter-electrode material, and further comprising after forming the apertures, immersing the electrode assembly in etching solution to thereby etch and remove at least a portion of the first inter-electrode material and a portion of the second inter-electrode material.

13. The method of claim 12, wherein immersing the electrode assembly in etching solution results in the formation of support structures in contact with either the first electrode and the second electrode, or in contact with the second electrode and the third electrode, and wherein the support structures are formed from the first inter-electrode structure and the second inter-electrode structure.

14. The method of claim 1, further comprising before or after forming the apertures, providing a fourth electrode to the electrode assembly, the fourth electrode being provided above the first electrode, wherein the fourth electrode forms a hollow cathode emitter electrode comprising a plurality of hollow cathode emitters.

15. The method of claim 14, wherein the hollow cathode emitter electrode comprises an upper surface and a lower surface, the lower surface facing the first electrode, and further comprising, before, during, or after forming the apertures in the first, second, and third electrodes, forming a plurality of holes in the hollow cathode emitter electrode, each hole having a diameter that is larger at the upper surface and smaller toward the lower surface, wherein the holes are aligned with a position of the apertures after the apertures are formed in the first, second, and third electrodes.

16. The method of claim 14, wherein the holes in the hollow cathode emitter electrode comprise a lower cylindrical portion and an upper variable diameter portion.

17. The method of claim 16, wherein the upper variable diameter portion comprises a funnel shape.

* * * * *